(12) United States Patent
Basker et al.

(10) Patent No.: US 10,049,985 B2
(45) Date of Patent: Aug. 14, 2018

(54) CONTACT LINE HAVING INSULATING SPACER THEREIN AND METHOD OF FORMING SAME

(71) Applicant: GLOBALFOUNDRIES INC., Grand Cayman (KY)

(72) Inventors: Veeraraghavan S. Basker, Schenectady, NY (US); Keith H. Tabakman, Gansevoort, NY (US); Patrick D. Carpenter, Saratoga Springs, NY (US); Guillaume Bouche, Albany, NY (US); Michael V. Aquilino, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/698,793

(22) Filed: Sep. 8, 2017

(65) Prior Publication Data
US 2017/0373007 A1    Dec. 28, 2017

Related U.S. Application Data

(62) Division of application No. 15/154,367, filed on May 13, 2016, now Pat. No. 9,812,400.

(51) Int. Cl.
| | |
|---|---|
| *H01L 29/40* | (2006.01) |
| *H01L 23/535* | (2006.01) |
| *H01L 29/78* | (2006.01) |
| *H01L 29/66* | (2006.01) |
| *H01L 29/417* | (2006.01) |
| *H01L 21/768* | (2006.01) |

(52) U.S. Cl.
CPC ...... *H01L 23/535* (2013.01); *H01L 21/76841* (2013.01); *H01L 21/76895* (2013.01); *H01L 29/41791* (2013.01); *H01L 29/66795* (2013.01); *H01L 29/785* (2013.01)

(58) Field of Classification Search
CPC ............. H01L 23/535; H01L 21/76841; H01L 21/76895; H01L 29/41791; H01L 29/66795; H01L 29/785
USPC ................................................. 257/346, 364
See application file for complete search history.

(56) References Cited

U.S. PATENT DOCUMENTS

| | | | | |
|---|---|---|---|---|
| 2006/0148134 A1* | 7/2006 | Hwang | ............. | H01L 27/10885 438/118 |
| 2009/0026515 A1* | 1/2009 | Shin | .................. | H01L 27/10888 257/296 |
| 2009/0140308 A1* | 6/2009 | Inoue | .................. | H01L 21/7687 257/296 |

(Continued)

*Primary Examiner* — Dzung Tran
(74) *Attorney, Agent, or Firm* — Francois Pagette; Hoffman Warnick LLC

(57) ABSTRACT

One aspect of the disclosure relates to an integrated circuit structure. The integrated circuit structure may include: a contact line being disposed within a dielectric layer and providing electrical connection to source/drain epitaxial regions surrounding a set of fins, the contact line including: a first portion of the contact line electrically isolated from a second portion of the contact line by a contact line spacer, wherein the first portion and the second portion each include a liner layer and a metal, the liner layer separating the metal from the dielectric layer and the source/drain epitaxial regions, and wherein the metal is directly in contact with the contact line spacer.

14 Claims, 21 Drawing Sheets

(56) References Cited

U.S. PATENT DOCUMENTS

| | | | |
|---|---|---|---|
| 2010/0059799 A1* | 3/2010 | Kim | H01L 21/28525 257/288 |
| 2011/0024811 A1* | 2/2011 | Kim | H01L 27/10876 257/296 |
| 2014/0077333 A1 | 3/2014 | Son | |
| 2015/0235950 A1 | 8/2015 | Han et al. | |

* cited by examiner

CONTACT LINE HAVING INSULATING SPACER THEREIN AND METHOD OF FORMING SAME

BACKGROUND

Technical Field

The present disclosure relates to integrated circuits, and more particularly, to contact lines having insulating spacers therein, and a method of forming the same.

Related Art

Transistors, e.g., field-effect-transistors (FETs), generally include source, drain, and gate terminals. The gate terminal controls current between the source and drain terminals. Transistors may be formed over a substrate and may be disposed within a dielectric layer, e.g., inter-level dielectric layer. Contacts may be formed to each of the source, drain, and gate terminals through the dielectric layer in order to provide electrical connection between the transistor and other semiconductor devices that may be formed subsequent to the transistor in other metal levels. The contacts to the source and drain terminals of the FET are typically formed in an opening that extends through a dielectric layer.

Contacts may be formed to include a liner layer, such as a refractory metal layer, barrier layer, or nucleation layer, which substantially lines or coats the opening. Additionally, a conductive metal may be formed over the liner layer to substantially fill the opening. Further, a planarization technique may be employed to remove any material outside of the opening to form contact lines.

Depending on the application for the integrated circuit, it may be desirable to provide an insulating spacer within contact lines to electrically isolate one portion of a contact line from another. However, as integrated circuits continue to be scaled down, the real estate on the integrated circuit becomes more valuable in order to maintain the performance characteristics comparable to that of larger integrated circuits.

SUMMARY

A first aspect of the disclosure relates to a method of forming contact line spacers. The method may include: forming a liner layer within a first trench over an exposed first source/drain epitaxial region of a fin-shaped field-effect-transistor (FINFET) to substantially line the first trench, and forming the liner layer within a second trench over an exposed second source/drain epitaxial region of the FINFET to substantially line the second trench; forming a sacrificial material over the liner layer within the first trench and the second trench to substantially fill the first trench and the second trench; removing a portion of the sacrificial material and a portion of the liner layer from the first trench to expose a first portion of the first source/drain epitaxial region thereunder and from the second trench to expose a second portion of the second source/drain epitaxial region thereunder; forming a dielectric film over the exposed first portion of the first source/drain epitaxial region within the first trench to form a first contact line spacer, and forming the dielectric film over the exposed second portion of the second source/drain epitaxial region within the second trench to form a second contact line spacer; and planarizing to a top surface of the dielectric layer.

A second aspect of the disclosure relates to a method of forming contact line spacers. The method may include: forming a liner layer within a first trench over an exposed first source/drain region of a fin-shaped field-effect-transistor (FINFET) to substantially line the first trench, and forming the liner layer within a second trench over an exposed second source/drain region of the FINFET to substantially line the second trench; forming a sacrificial material over the liner layer within the first trench and the second trench to substantially fill the first trench and the second trench; removing a portion of the sacrificial material and a portion of the liner layer from the first trench to expose a first portion of the first source/drain region thereunder and from the second trench to expose a second portion of the second source/drain region thereunder; forming a dielectric film over the exposed first portion of the first source/drain region within the first trench to form a first contact line spacer, and forming the dielectric film over the exposed second portion of the second source/drain region within the second trench to form a second contact line spacer; and planarizing to a top surface of the dielectric layer.

A third aspect of the disclosure relates to an integrated circuit structure. The integrated circuit structure may include: a contact line being disposed within a dielectric layer and providing electrical connection to source/drain epitaxial regions surrounding a set of fins, the contact line including: a first portion of the contact line electrically isolated from a second portion of the contact line by a contact line spacer, wherein the first portion and the second portion each include a liner layer and a metal, the liner layer separating the metal from the dielectric layer and the source/drain epitaxial regions, and wherein the metal is directly in contact with the contact line spacer.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the invention. In the drawings, like numbering represents like elements between the drawings.

DETAILED DESCRIPTION

The present disclosure relates to integrated circuits, and more particularly, to spacers between source/drain terminal contact lines, and a method of forming the same.

Figure 1A:
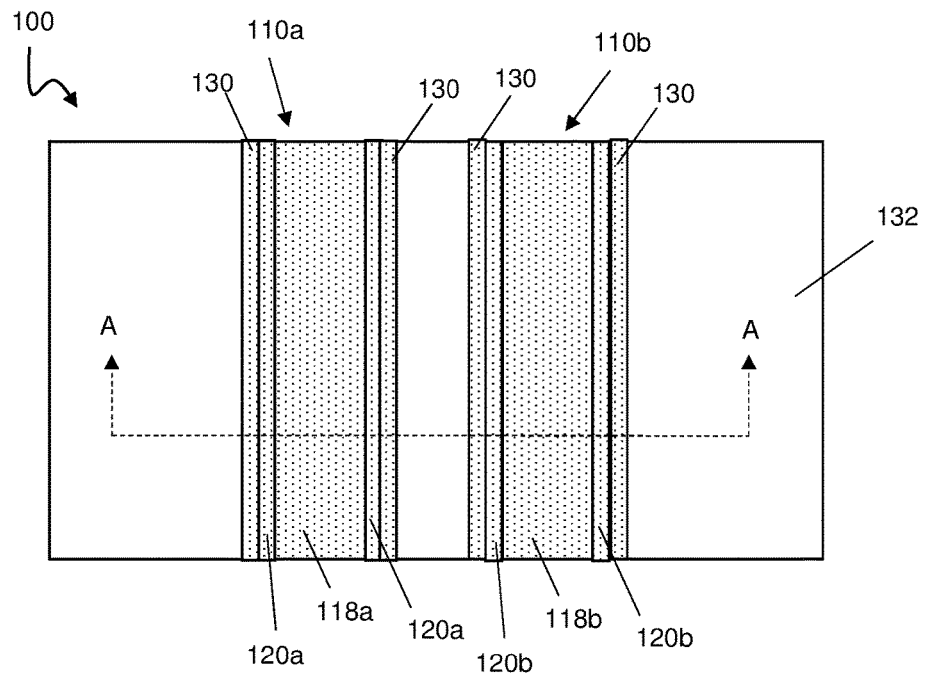
FIGS. 1A-1B show a preliminary integrated circuit structure with FIG. 1A showing a top-down view of the preliminary integrated circuit structure and FIG. 1B showing a cross-sectional view of the preliminary integrated circuit structure taken along line A-A of FIG. 1A.
Figure 1B:
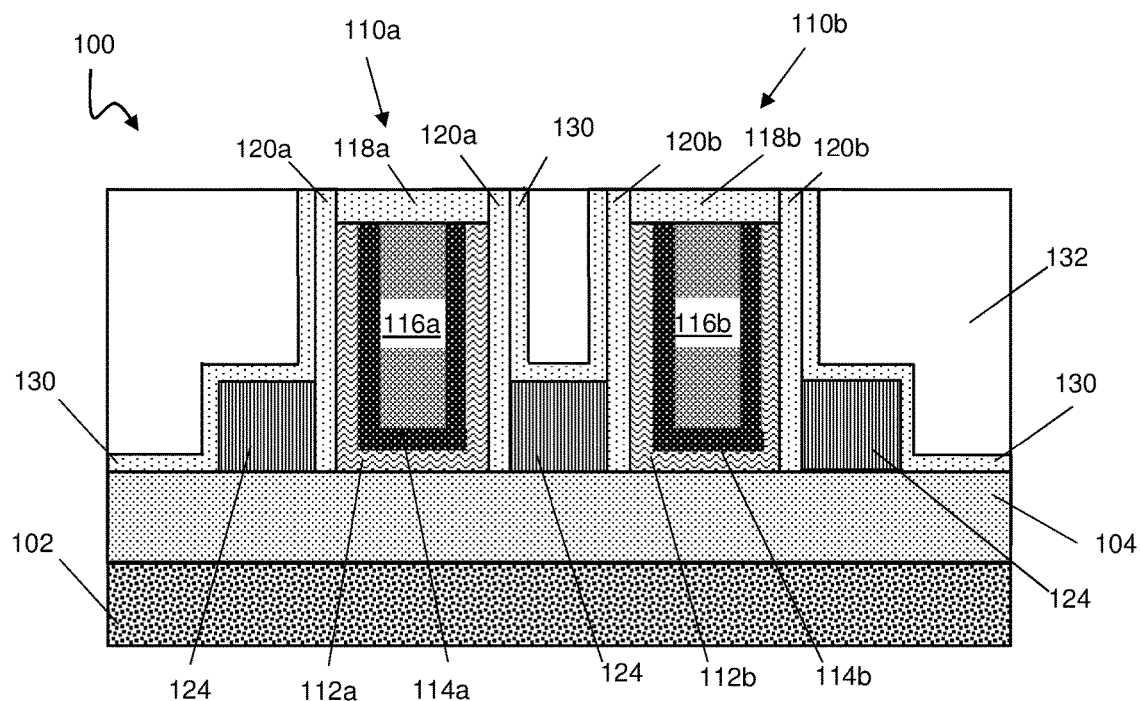

FIG. 1A shows a top-down view of a preliminary integrated circuit (IC) structure 100. FIG. 1B shows a cross-sectional view of preliminary IC structure 100 taken along line A-A of FIG. 1A. Referring to FIGS. 1A-1B together, IC structure 100 may include a substrate 102 (FIG. 1B) from which a set of fins, e.g., fin 104 (FIG. 1B), were patterned. In one embodiment, substrate 102 may include a bulk substrate. Bulk substrates generally include a layer or wafer of semiconducting material without buried insulator layers contained therein, in contrast to semiconductor-on-insulator (SOI) substrates which include both semiconducting and insulating materials. Conventional fin-shaped field-effect-transistors (FINFETs) are formed within SOI substrate materials, but can be adapted for use within a bulk substrate despite the absence of buried insulator materials. Substrate 102 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of bulk substrate 102 or a portion thereof may be strained. In other embodiments, substrate 102 may include an SOI substrate (not shown). In such an embodiment, set of fins, e.g., fin 104, may be patterned from a semiconducting layer overlying an insulating layer overlying another semiconducting layer as is known in the art.

Fins, e.g., fin 104, may be patterned and etched from substrate 102 as known in the art. While embodiments of the disclosure are described relative to fin-shaped field-effect-transistors (FINFETS), it is to be understood that embodiments of the disclosure are equally applicable to other types of FETs. While only one fin has been shown in FIGS. 1A-1B, additional fins will be described elsewhere herein, and it is to be understood that there may be any number of fins adjacent to fin 104 on substrate 102. Further, there may be shallow trench isolation (STI) regions (not shown in FIGS. 1A-1B but described elsewhere herein) between adjacent fins.

Gate structures 110a, 110b may overly the set of fins, e.g., 104. Gate structures 110a, 110b may be formed such that gate structures 110a, 110b are perpendicular to fin 104 and substantially surround fin 104. Gate structures 110a, 110b may also be formed such that gate structures 110a, 110b are over at least a portion of substrate 102. Gate structures 110a, 110b may each include a layer having a high dielectric constant (high-k layer) 112a, 112b (FIG. 1B). Overlying high-k layers 112a, 112b may be work function metal layers 114a, 114b (FIG. 1B), respectively, and overlying work function metal layers 114a, 114b may be gate conductors 116a, 116b (FIG. 1B), respectively. Further, gate structures 110a, 110b may each include a gate cap layer 118a, 118b overlying gate conductor 116a, 116b. While two adjacent gate structures are shown and described herein, the disclosure is equally applicable to other types of FETs having more or less gate structures. Additionally, it is to be understood that gate structures 110a, 110b may include additional materials and/or layer known in gate structure construction without departing from aspects of the disclosure.

High-k layers 112a, 112b may each include an insulating material whose dielectric constant (k), is greater than that of silicon dioxide, e.g., greater than 4.0. High-k layers 112a, 112b may include, for example, at least one of: hafnium oxide, hafnium silicate, nitride hafnium silicate, zirconium oxide, zirconium silicate, titanium oxide, lanthanum oxide, yttrium oxide, aluminum oxide, or combinations thereof. Work function metal layers 114a, 114b may each act as a doping source, and a different work function setting metal can then be employed depending on whether a n-type field-effect-transistor (NFET) or a p-type field-effect-transistor (PFET) device is desired. Thus, the same gate conductor 116a, 116b can be used in each of the devices, yet a different (if so desired) work function setting metal can be used in one or more devices to obtain a different doping polarity. By way of example only, suitable work function setting metals for use in PFET devices include, but are not limited to aluminum, dysprosium, gadolinium, and ytterbium. Suitable work function setting metals for use in NFET devices include, but are not limited to lanthanum, titanium, and tantalum. Gate conductors 116a, 116b may each include, for example, at least one of: titanium, titanium nitride, tungsten, tungsten nitride, copper, copper nitride, tantalum, or tantalum nitride. Gate cap layers 118a, 118b may each include, for example, at least one of: an oxide, e.g., silicon dioxide, or a nitride, e.g., silicon nitride.

Gate structures 110a, 110b may be formed as known in the art. For example, gate structures 110a, 110b may be formed by a gate-last process. In a gate-last process, a sacrificial or dummy gate structure (not shown) is first formed by depositing, patterning, and etching a sacrificial material, e.g., polysilicon, over and around fin 104 and over at least a portion of substrate 102, or by other conventional lithographic techniques. Subsequently, gate spacers 120a, 120b may be formed immediately adjacent to the dummy gate structure such that gate spacers 120a, 120b are also formed over and around fin 104 and over at least a portion of substrate 102. Gate spacers 120a, 120b may be formed by depositing, patterning, and etching gate spacer materials discussed herein, or by other lithographic techniques. Gate spacers 120a, 120b may each be formed on opposing sides of gate structures 110a, 110b such that gate spacers 120a, 120b are substantially perpendicular to fin 104 (into and out of the page). Gate spacers 120a, 120b may include, for example, at least one of: an oxide, e.g., silicon dioxide, or a nitride, e.g., silicon nitride.

As used herein, the term "depositing" may include any now known or later developed technique appropriate for the material being deposited, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

"Etching" generally refers to the removal of material from a substrate or structures formed on the substrate. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, neutrally charged, that react at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as STI trenches.

After gate spacers 120a, 120b are formed, source/drain epitaxial regions 124 may be formed over fin 104. Source/drain epitaxial regions 124 may be formed by forming a mask (not shown) over fins, e.g., fin 104, and patterning the mask to expose portions of the fins where epitaxial source/drain regions 124 are desired to be formed, and epitaxially growing any of the source/drain epitaxial materials discussed herein over the exposed portions of the fins. Source/drain epitaxial regions 124 may include an epitaxial material, e.g., silicon, silicon germanium, or other semiconducting material, that is doped with one of p-type or n-type dopants. P-type dopants may include but are not limited to: boron, indium, and gallium. P-type is element introduced to semiconductor to generate free hole (by "accepting" electron from semiconductor atom and "releasing" hole at the same time); acceptor atom must have one valence electron less than host semiconductor; boron is the most common acceptor in silicon technology; alternatives include indium and gallium (gallium features high diffusivity in silicon dioxide, and hence, oxide cannot be used as mask during gallium diffusion). N-type dopants may include but are not limited to: phosphorous, arsenic, antimony. N-type is element introduced to semiconductor to generate free electron (by "donating" electron to semiconductor); must have one more valance electron than semiconductor; common donors in silicon: phosphorous, arsenic, antimony and in gallium arsenic: sulphur, selenium, tin, silicon, and carbon.

In other embodiments, portions of the fins, e.g., fin 104, that are exposed by the mask may be directly doped with p-type or n-type dopants without epitaxial regions thereover to create source/drain regions from the fins. While not shown herein for brevity, epitaxial source/drain regions 124 may have a substantially diamond-like cross-sectional shape as known in the art but not shown herein for brevity. Epitaxial source/drain regions 124 may substantially surround the fins, e.g. fin 104. Further, source/drain epitaxial regions 124 may be doped with a p-type or n-type dopant depending on whether a PFET of NFET device is desired. Together, gate structures 110a, 110b and fins 104 having source/drain epitaxial regions 124 may form adjacent field-effect-transistors (FETs), e.g., FINFETs.

A "mask" is a material or stack of materials which may be formed over an underlying material which is to be processed. The mask may be patterned to have openings such that the underlying material is exposed. Subsequently, the underlying material may be processed where the underlying material is exposed by the openings in the mask. Once the underlying material is processed, the mask may be removed. Conventional masking materials include photoresist and nitride.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

After source/drain epitaxial regions 124 are formed, the mask may be removed and a dielectric cap layer 130 may be formed. Dielectric cap layer 130 may be formed over exposed portions of the set of fins, e.g., fin 104, source/drain epitaxial regions 124, and over the dummy gate structure. Dielectric cap layer 130 may include, for example, at least one of: an oxide, e.g., silicon dioxide, or a nitride, e.g., silicon nitride. Additionally, an inter-level dielectric layer 132 may be formed over dielectric cap layer 130. Inter-level dielectric (ILD) layer 132 may include, for example, at least one of: silicon nitride, silicon oxide, fluorinated $SiO_2$ (FSG), hydrogenated silicon oxycarbide (SiCOH), porous SiCOH, boro-phospho-silicate glass (BPSG), silsesquioxanes, carbon doped oxides (i.e., organosilicates) that include atoms of silicon, carbon, oxygen, and/or hydrogen, thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Dielectric cap layer 130 and ILD layer 132 may be planarized to a top surface of the dummy gate structure such that the dummy gate structure and spacers 120a, 120b are exposed. Subsequently, the dummy gate structures are removed leaving openings where the dummy gate structures once were to expose a top surface of fins, e.g., fin 104, thereunder. The openings are then filled with high-k dielectric layer 112a, 112b, work function metal layers 114a, 114b, gate conductors 116a, 116b, and gate cap layer 118a, 118b as is known in the art to create gate structures 110a, 110b. Gate structures 110a, 110b are active gate structures which control current between source/drain epitaxial regions 124. The resulting structure after gate structures 110a, 110b are shown in FIGS. 1A-1B.

In other embodiments, gate structures 110a, 110b may be formed via a gate first process. In a gate-first process, active gate structures, e.g., gate structures 110a, 110b are formed at the outset instead of forming dummy gate structures as was previously described.

Figure 2A:
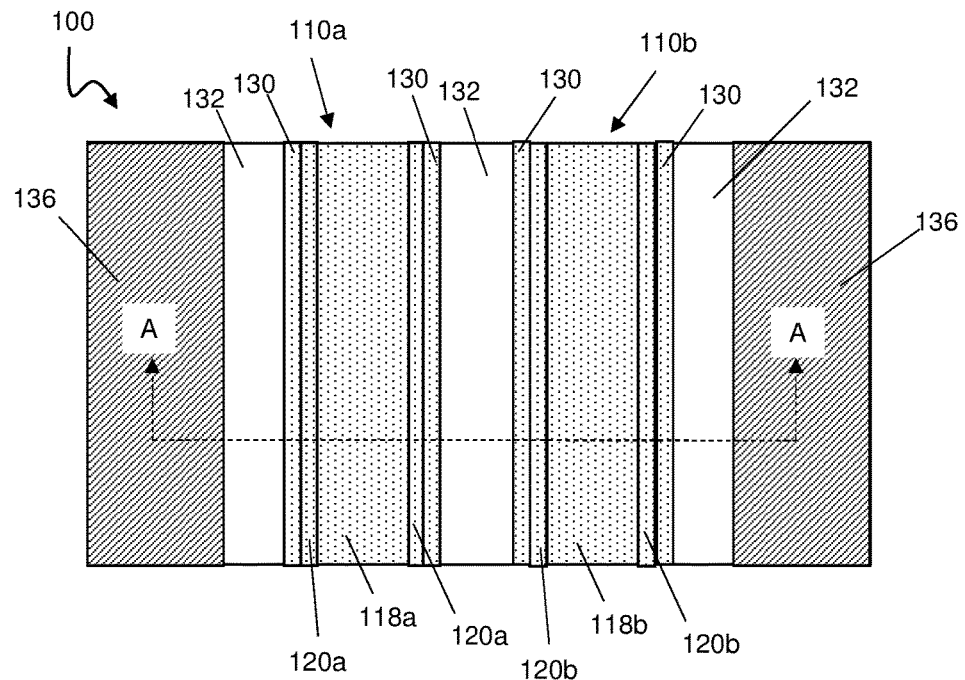
FIGS. 2A-2B show the integrated circuit structure undergoing aspects of a method according to embodiments of the disclosure with FIG. 2A showing a top-down view of the integrated circuit structure and FIG. 2B showing a cross-sectional view of the integrated circuit structure taken along line A-A of FIG. 2A.
Figure 2B:
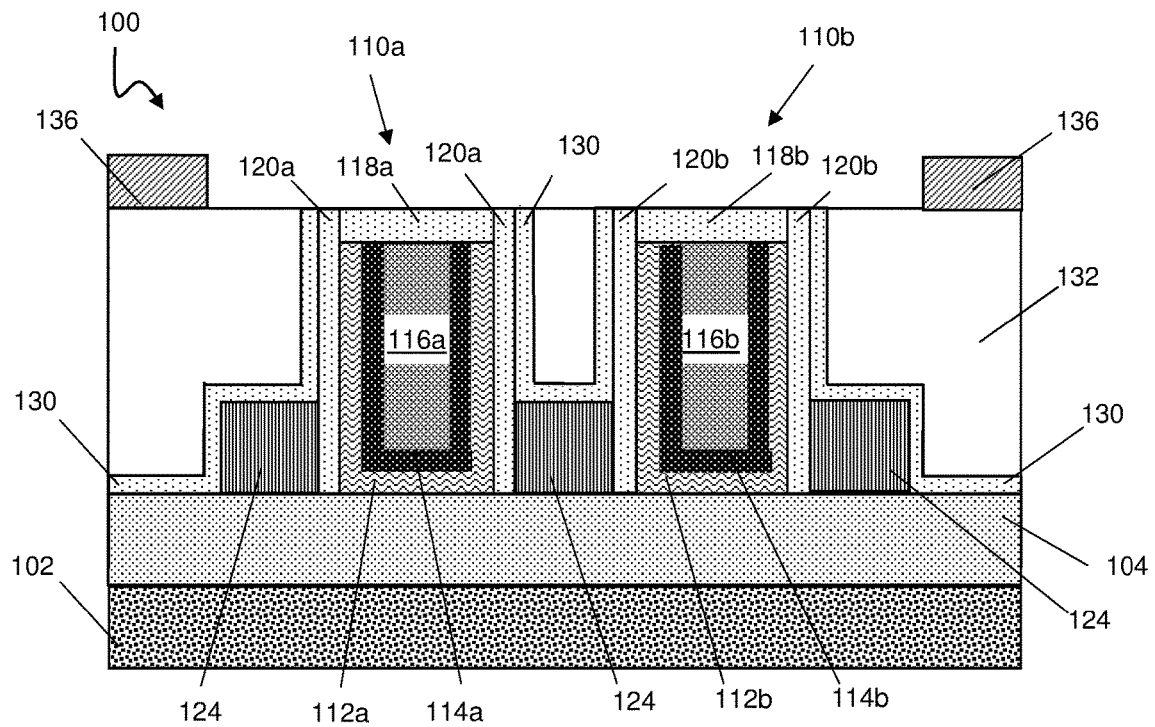

Referring now to FIGS. 2A-2B, a mask 136 may be formed, e.g., deposited, over IC structure 100 and patterned and etched to expose locations where etching of the underlying material is desired. For example, as shown, mask 136 may be patterned and etched to expose gate structures 110a, 110b, i.e., gate cap 118a, 118b of gate structures 110a, 110b, spacers 120a, 120b, portions of dielectric cap layer 130 that are adjacent to spacers 120a, 120b, and portions of ILD layer 132 that are adjacent to gate structures 110a, 110b. That is, mask 136 may be etched to expose gate structures 110a, 110b and areas over where source/drain epitaxial regions 124 are located.

Figure 3A:
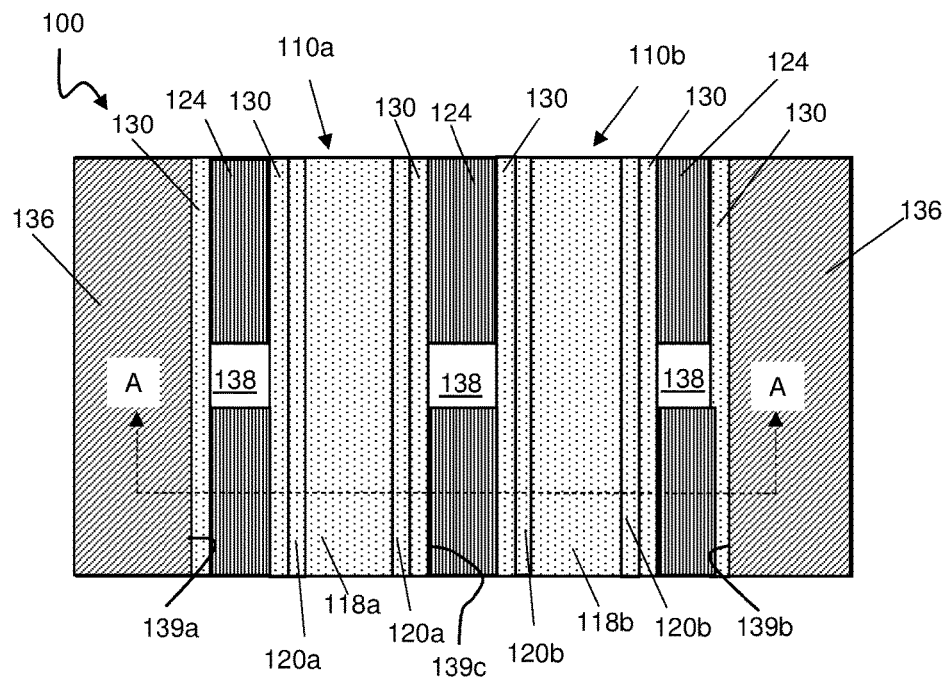
FIGS. 3A-3B show the integrated circuit structure undergoing aspects of a method according to embodiments of the disclosure with FIG. 3A showing a top-down view of the integrated circuit structure and FIG. 3B showing a cross-sectional view of the integrated circuit structure taken along line A-A of FIG. 3A.
Figure 3B:
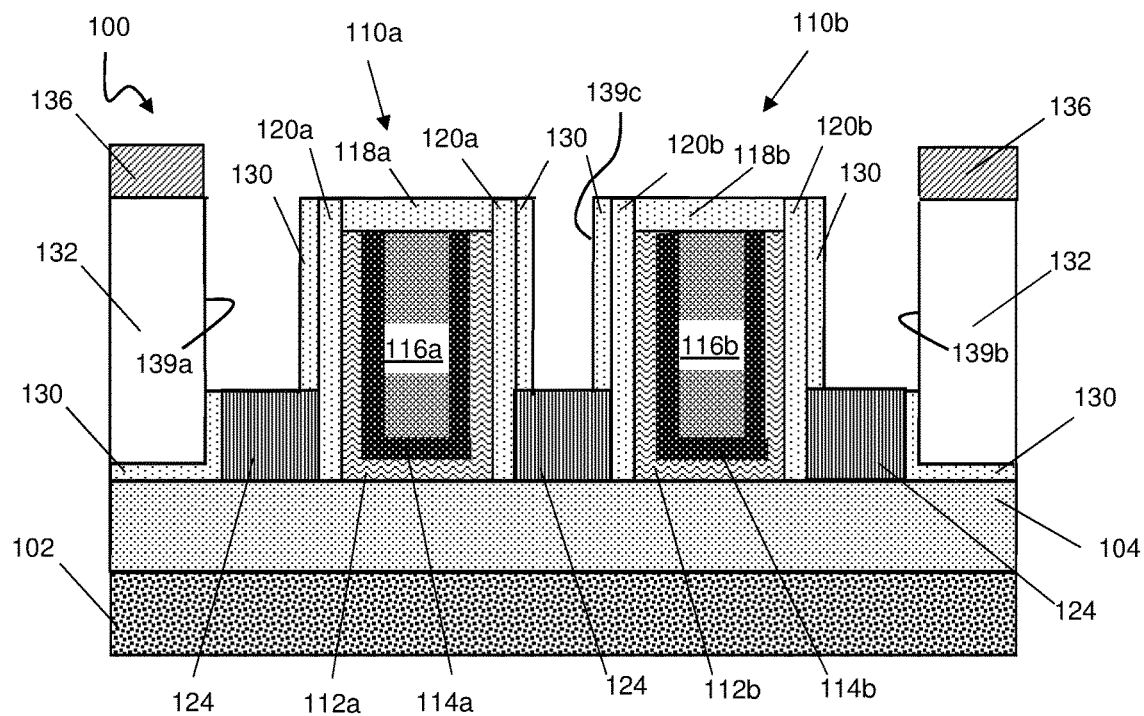

As shown in FIGS. 3A-3B, a RIE etch may be performed on IC structure 100 such that portions of ILD layer 132 and dielectric cap layer 130 exposed by openings in mask 136 are removed to form trenches 139a, 139b, 139c over source/drain epitaxial regions 124. The RIE etch is performed such that only horizontal portions of insulating materials, i.e., ILD layer 132 and dielectric cap layer 130, are removed. Therefore, source/drain epitaxial regions 124 are exposed. Vertical portions of dielectric cap layer 130 may remain. That is, vertical portions of dielectric cap layer 130 adjacent to spacers 120a, 120b and source/drain epitaxial regions 124 may remain. However, in other embodiments (not shown), it may be desirable to remove the vertical portions of dielectric cap layer 130 from adjacent to spacers 120a, 120b. In such an embodiment, the removal of the vertical portions of the dielectric cap layer 130 adjacent to spacers 120a, 120b may be removed by reactive ion etch (RIE). Additionally, in some embodiments (shown), STI regions 138 (FIG. 3A) between adjacent fins may also be exposed. As known in the art, STI regions may isolate one region of a substrate from an adjacent region of the substrate. One or more transistors of a given polarity may be disposed within an area isolated by the STI region.

Figure 4A:
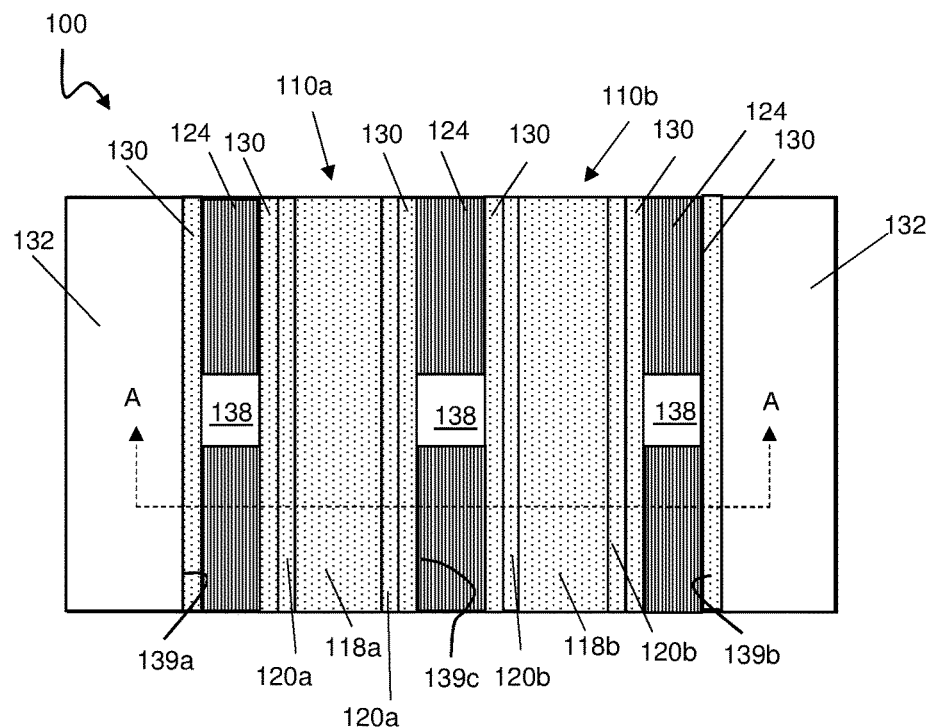
FIGS. 4A-4B show the integrated circuit structure undergoing aspects of a method according to embodiments of the disclosure with FIG. 4A showing a top-down view of the integrated circuit structure and FIG. 4B showing a cross-sectional view of the integrated circuit structure taken along line A-A of FIG. 4A.
Figure 4B:
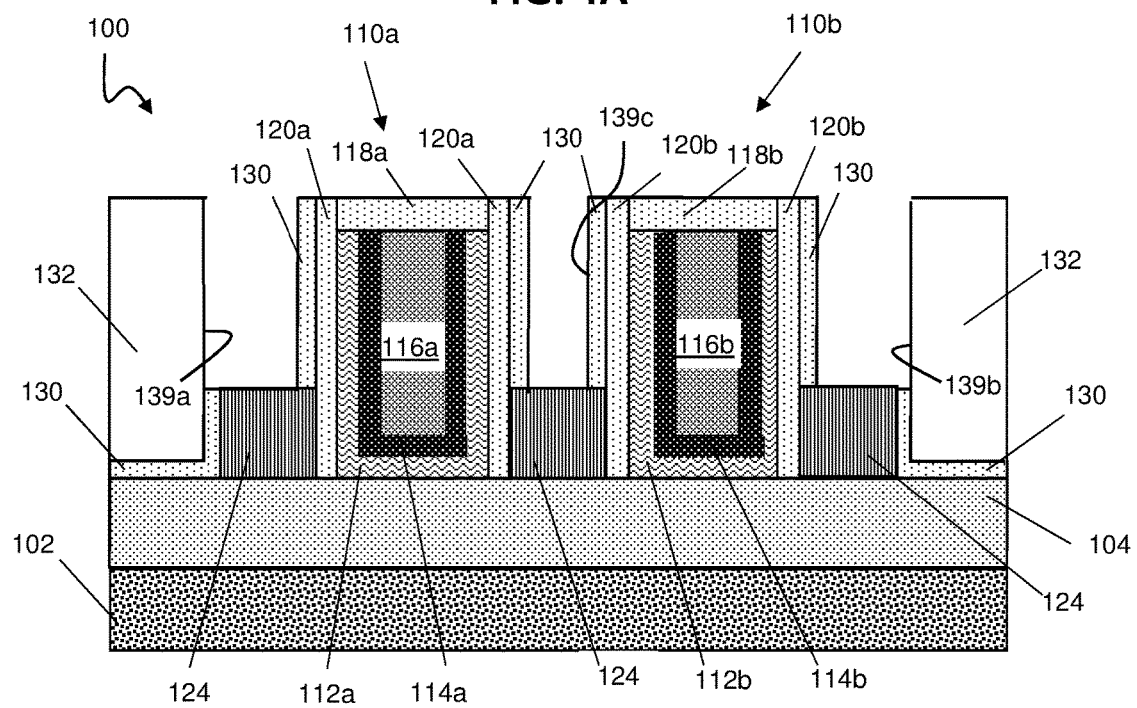

Trenches 139a, 139b, 139c may extend along source/drain epitaxial regions 124 and STI regions 138 as shown in FIG. 3A. As used herein, trench 138a may refer to the trench that is formed over source/drain epitaxial region 124 between gate structure 110a and ILD layer 132, trench 139b may refer to the trench that is formed over source/drain epitaxial region 124 between gate structure 110b and ILD layer 132, and trench 139c may refer to the trench over source/drain epitaxial region 124 between gate structure 110a and 110b. After etching, mask 136 (FIGS. 3A-3B) may be removed as shown in FIGS. 4A-4B, which can be completed by using any no known or later developed resist strip, in-situ or ex-situ. As will be described herein, trenches 139a, 139b, 139c facilitate the formation of contact lines to source/drain epitaxial regions 124.

Figure 5A:
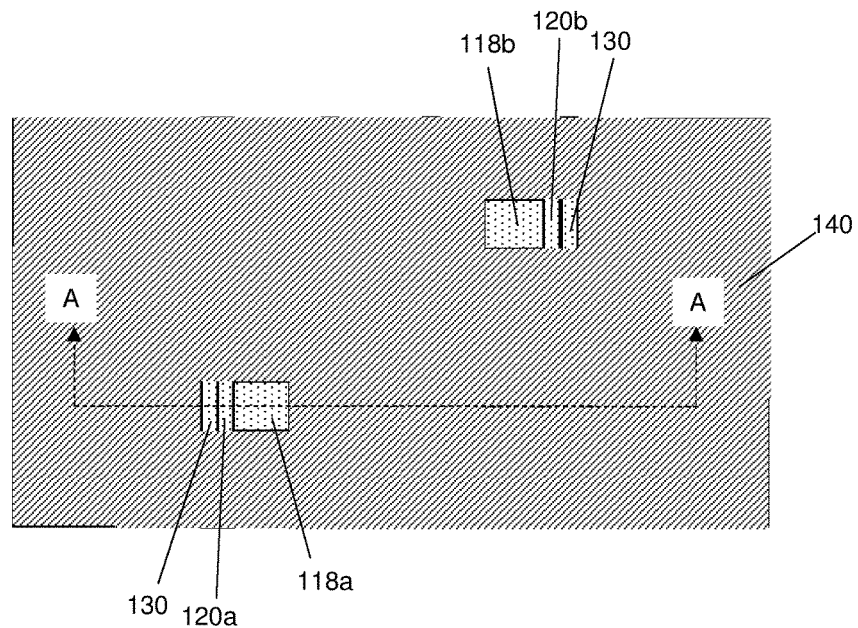
FIGS. 5A-5B show the integrated circuit structure undergoing aspects of a method according to embodiments of the disclosure with FIG. 5A showing a top-down view of the integrated circuit structure and FIG. 5B showing a cross-sectional view of the integrated circuit structure taken along line A-A of FIG. 5A.
Figure 5B:
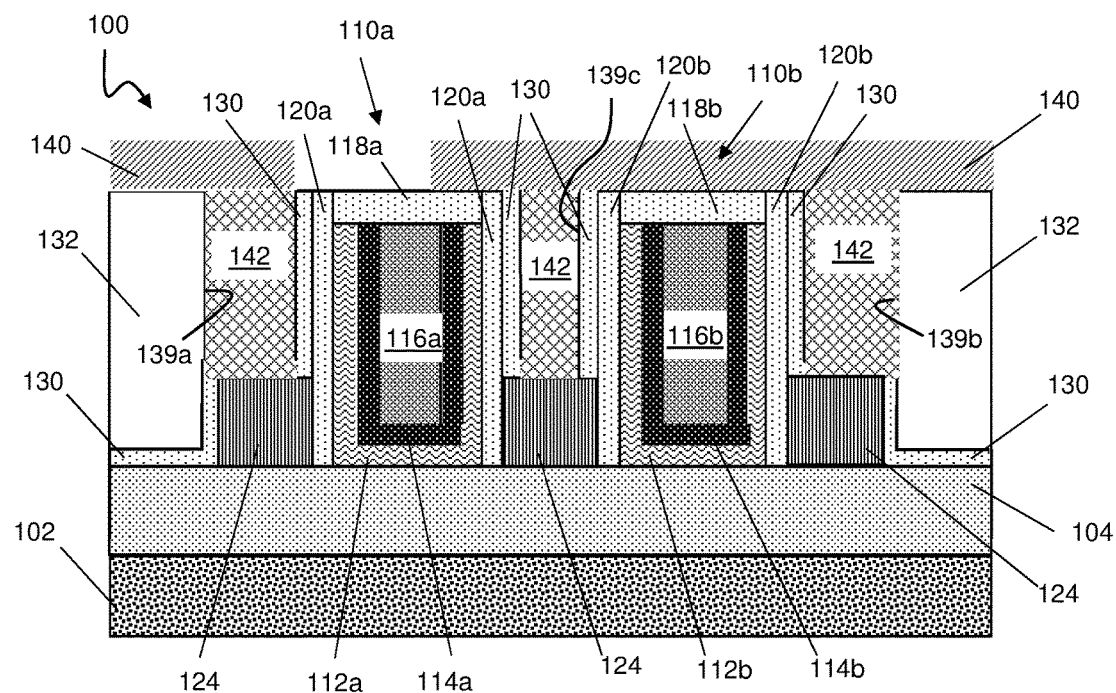

Referring now to FIGS. 5A-5B, another mask 140 may be formed, e.g., deposited, over IC structure 100. Mask 140 may include an amorphous carbon portion 142 which covers exposed source/drain epitaxial regions 124 within trenches 139a, 139b, 139c. Mask 140 may be patterned and etched to expose portions of gate structures 110a, 110b at locations where electrical connections to gate structures 110a, 110b are desired to be made. That is, mask 140 may be patterned and etched such that at least a portion of gate cap layer 118a, 118b is exposed. In some embodiments (shown), mask 140 may be patterned and etched such that spacers 120a, 120b and dielectric cap layer 130 adjacent to spacers 120a, 120b are also exposed. FIG. 5B shows a cross-section of IC structure 100 taken along line A-A. Therefore, FIG. 5B, shows spacer 120a as being exposed, but not spacer 120b. As shown in FIG. 5A, spacers 120b may be exposed elsewhere within IC structure 100.

Figure 6A:
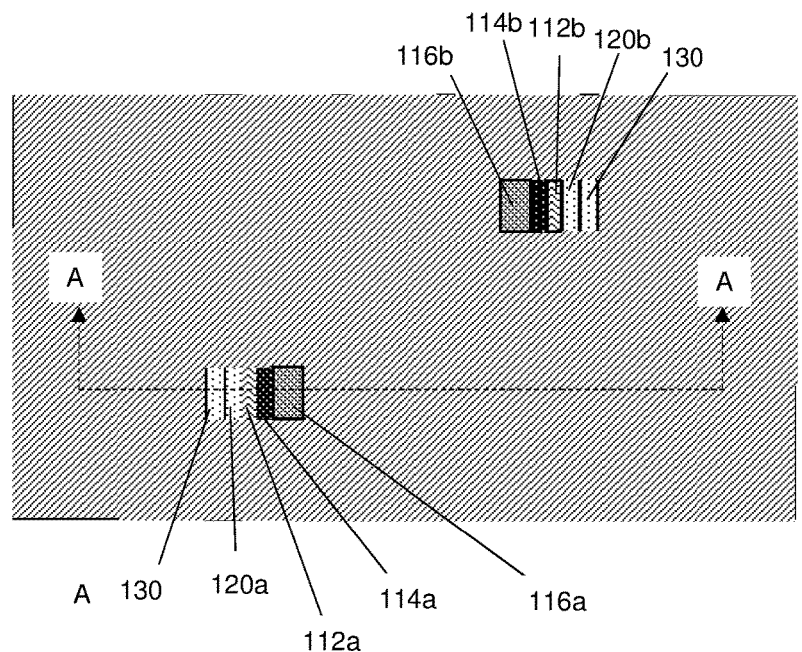
FIGS. 6A-6B show the integrated circuit structure undergoing aspects of a method according to embodiments of the disclosure with FIG. 6A showing a top-down view of the integrated circuit structure and FIG. 6B showing a cross-sectional view of the integrated circuit structure taken along line A-A of FIG. 6A.
Figure 6B:
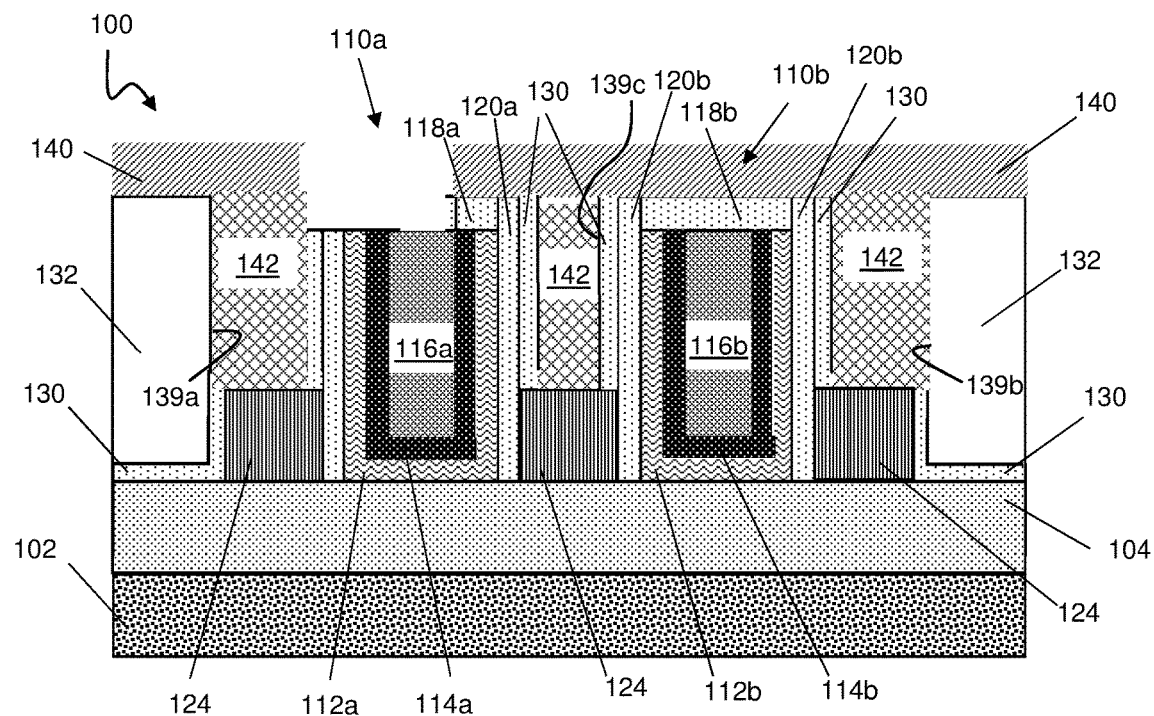
Figure 7A:
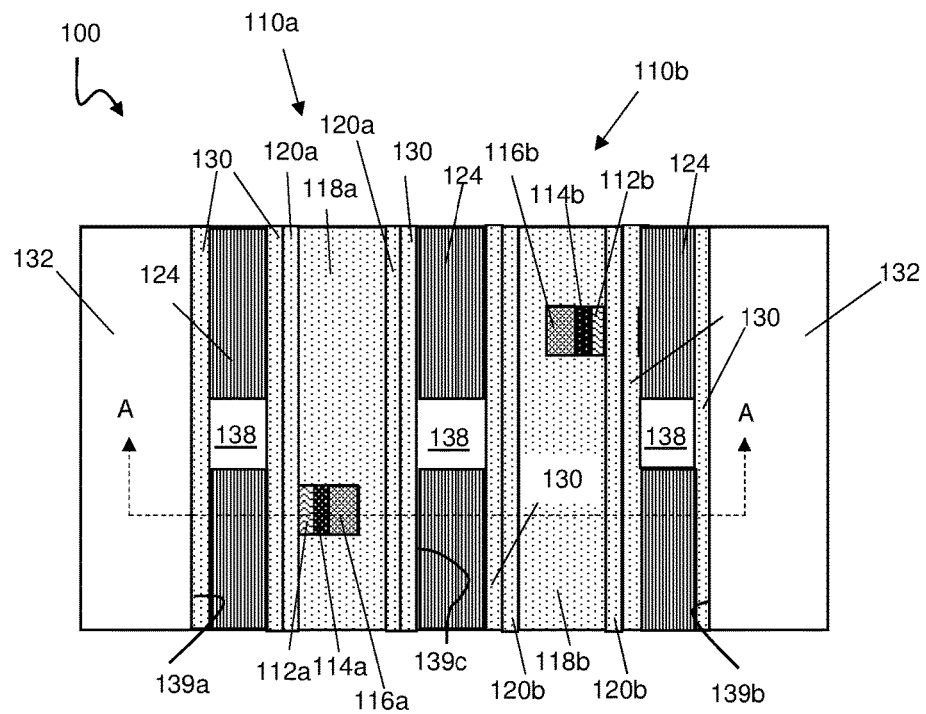
FIGS. 7A-7B show the integrated circuit structure undergoing aspects of a method according to embodiments of the disclosure with FIG. 7A showing a top-down view of the integrated circuit structure and FIG. 7B showing a cross-sectional view of the integrated circuit structure taken along line A-A of FIG. 7A.
Figure 7B:
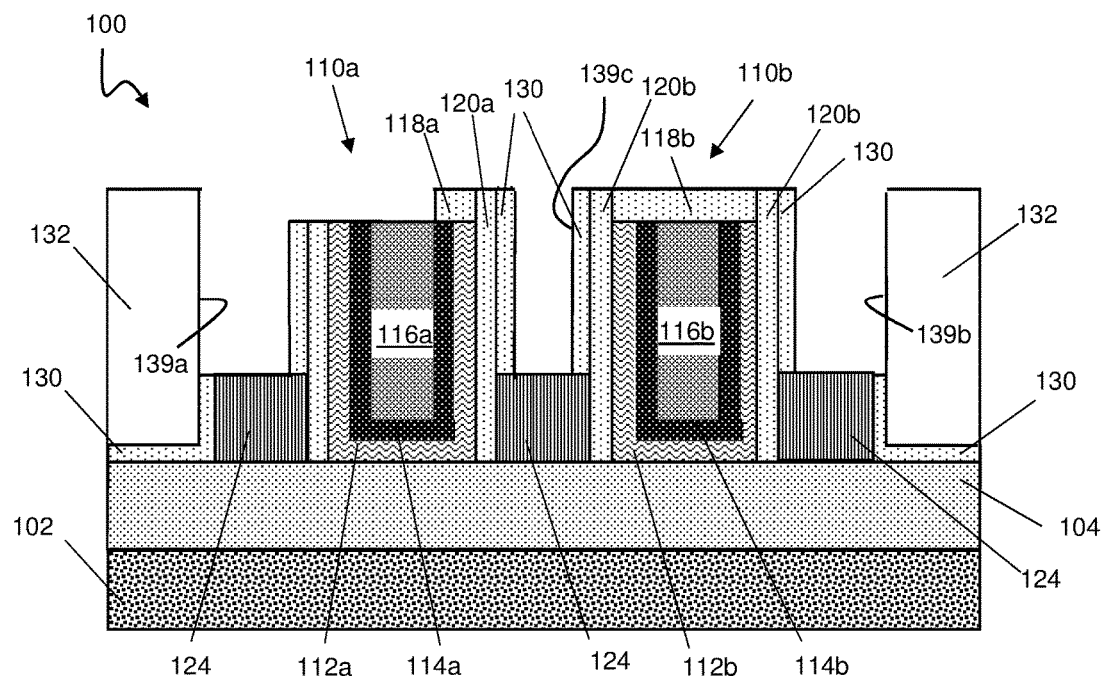

Referring now to FIGS. 6A-6B, the exposed portions of gate cap layer 118a, 118b (and in some instances, spacers 120a, 120b and dielectric cap layer 130) may be removed. That is, a RIE may be performed on IC structure 100 such that portions of gate cap layer 118a, 118b, spacers 120a, 120b, and dielectric cap layer 130 are removed until portions of gate conductors 116a, 116b are exposed. In doing so, portions of work function metal layers 114a, 114b and high-k dielectric layer 112a, 112b may also be exposed. As shown in FIGS. 7A-7B, mask 140 (FIGS. 6A-6B), including amorphous carbon portion 142 (FIGS. 6A-6B), may be removed by any now know or later developed resist strip, in-situ or ex-situ. The removal of mask 140 exposes ILD layer 132, source/drain epitaxial regions 124 and STI regions 138 within trenches 139a, 139b, 139c, gate structures 110a, 110b, and portions of dielectric cap layer 130 that were previously covered by mask 140 including amorphous carbon portion 142.

Figure 8A:
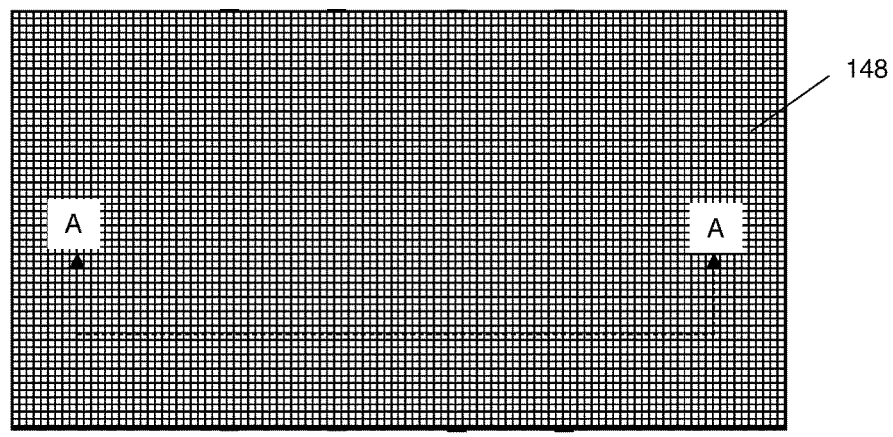
FIGS. 8A-8B show the integrated circuit structure undergoing aspects of a method according to embodiments of the disclosure with FIG. 8A showing a top-down view of the integrated circuit structure and FIG. 8B showing a cross-sectional view of the integrated circuit structure taken along line A-A of FIG. 8A.
Figure 8B:
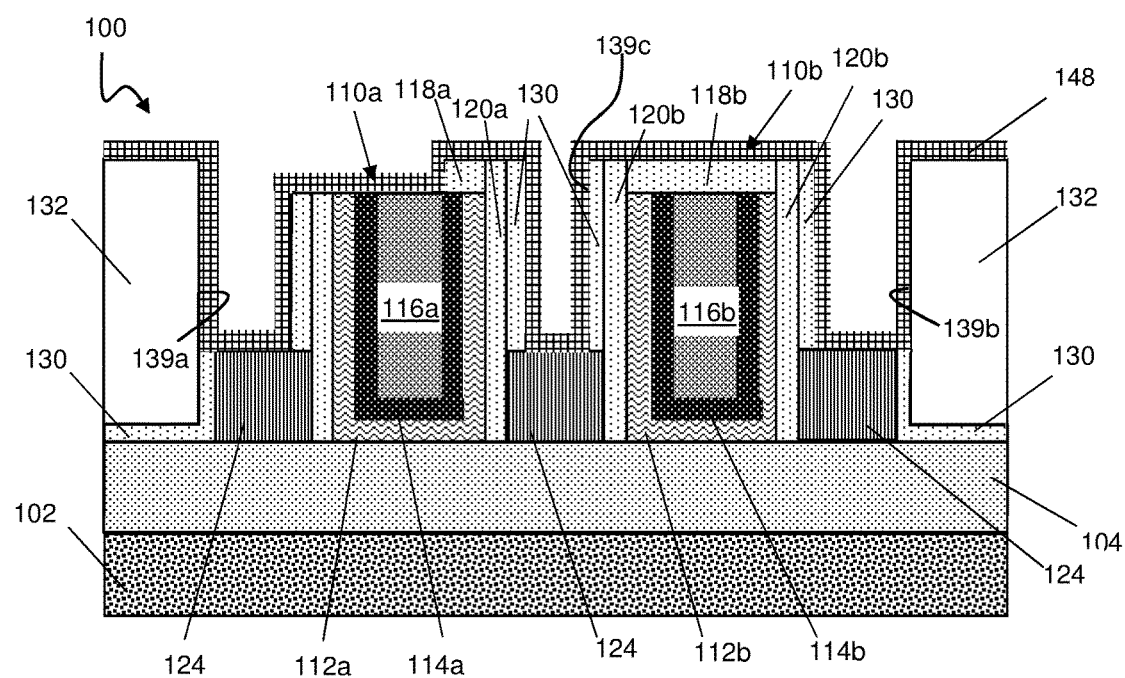

Referring now to FIGS. 8A-8B, a liner layer 148 may be formed, e.g., deposited, over IC structure 100 such that liner layer 148 substantially coats the entire IC structure 100. In the embodiment shown, liner layer 148 may be formed over exposed ILD layer 132, exposed source/drain epitaxial regions 124 and exposed STI regions 138 (FIGS. 7A-7B) within trenches 139a, 139b, 139c, gate structures 110a, 110b, and spacers 120a, 120b. Additionally, any remaining portions of dielectric cap layer 130 adjacent to spacers 120a, 120b, and source/drain epitaxial regions 124 may also be covered by liner layer 148. Since gate structures 110a, 110b have been partially etched at some locations, liner layer 148 may be in direct contact with the exposed portions of gate conductors 116a, 116b, work function metal layers 114a, 114b, and high-k layers 112a, 112b of gate structures 110a, 110b. This can best be seen with respect to gate structure 110a in FIG. 8B.

In some embodiments, the processes as described with respect to FIGS. 5A-7B may be optional and the process as described with respect to FIGS. 8A-8B may immediately follow the process as described with respect to FIGS. 4A-4B. In such an embodiment, liner layer 148 may be formed over exposed ILD layer 132, exposed source/drain epitaxial regions 124, exposed STI regions 138 (FIGS. 3A-3B), spacers 120a, 120b, and gate cap layer 118a, 118b of gate structures 110a, 110b. Additionally, liner layer 148 may be formed over any remaining portions of dielectric cap layer 130 adjacent to spacers 120a, 120b and adjacent to source/drain epitaxial regions 124 within trenches 139a, 139b, 139c. In any embodiment, liner layer 148 may include, for example, at least one of: titanium, titanium nitride, tantalum, tantalum nitride, combinations thereof, or other refractory metal having similar properties. Liner layer 148 may be formed to have a thickness of approximately 1 nanometer (nm) to approximately 10 nm, or more particularly, about 4 nm.

Figure 9A:
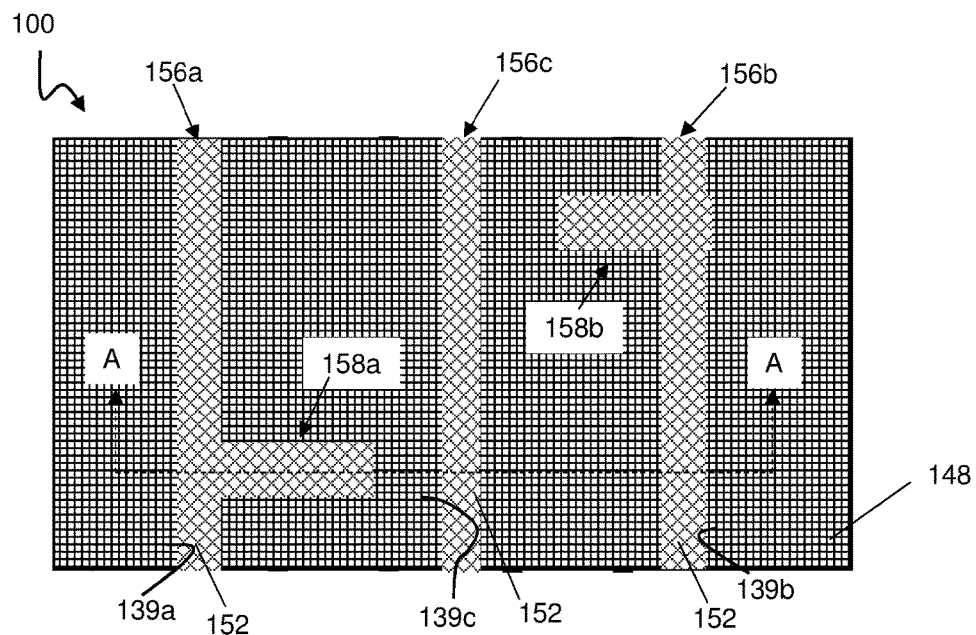
FIGS. 9A-9B show the integrated circuit structure undergoing aspects of a method according to embodiments of the disclosure with FIG. 9A showing a top-down view of the integrated circuit structure and FIG. 9B showing a cross-sectional view of the integrated circuit structure taken along line A-A of FIG. 9A.
Figure 9B:
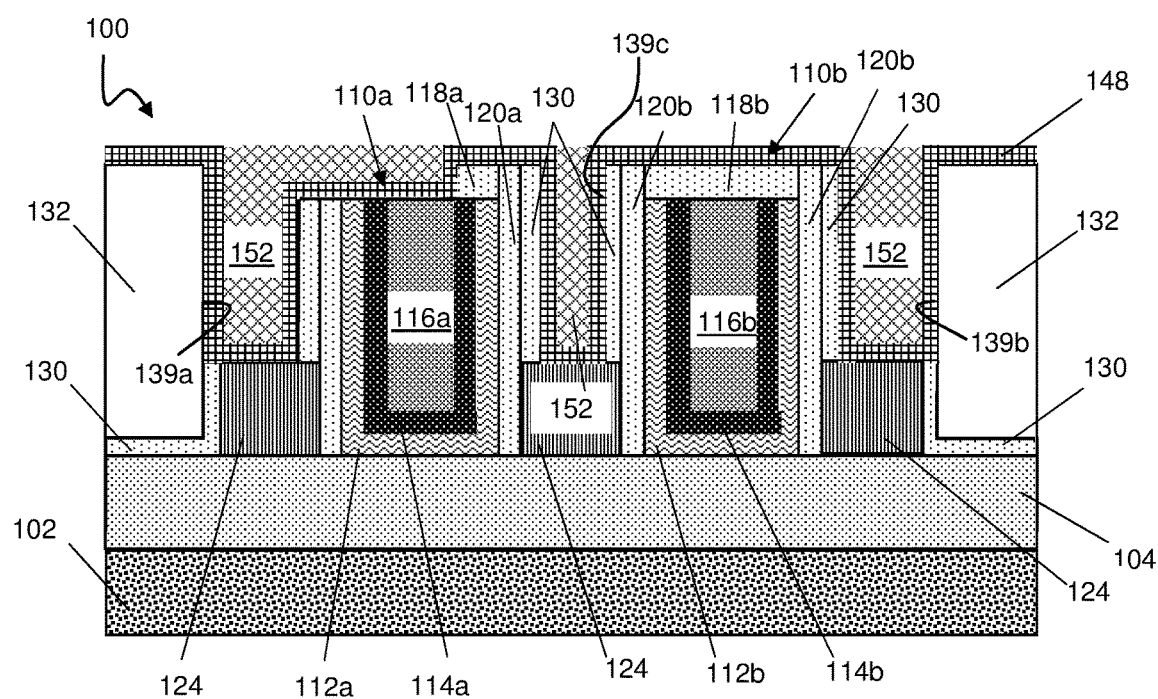

As shown in FIGS. 9A-9B, after liner layer 148 is formed, a sacrificial material 152 may be formed over liner layer 148. Sacrificial material 152 may include, for example, at least one of: amorphous carbon or amorphous silicon. Within trenches 139a, 139b, 139c, sacrificial material 152 may be formed from over liner layer 148 over source/drain epitaxial regions 124 and STI regions 138 (FIGS. 7A-7B) and extend past a top surface of ILD layer 132 such that sacrificial material 152 covers liner layer 148 over ILD layer 132. Subsequently, sacrificial material 152 may be etched back such that sacrificial material 152 within trenches 139a, 139b, 139c is planar with liner layer 148 over ILD layer 132. Additionally, where portions of gate conductors 116a, 116b were exposed as described with respect to FIGS. 5A-7B, sacrificial material 152 over exposed gate conductors 116a, 116b may be etched back to a top surface of liner layer 148 over ILD layer 132. The etch back process creates sacrificial contact lines 156a, 156b, 156c over source/drain epitaxial regions 124 and STI regions 138 (FIG. 7A) within trenches 139a, 139b, 139c. Additionally, where portions of gate conductors 116a, 116b were exposed as described with respect to FIGS. 5A-7B, sacrificial contact lines 158a, 158b may be formed over portions of gate structures 110a, 110b. As shown, sacrificial contact lines 156a and sacrificial contact lines 158a may be continuous with one another, and sacrificial contact lines 156b and sacrificial contact lines 158b may be continuous with one another.

Figure 10A:
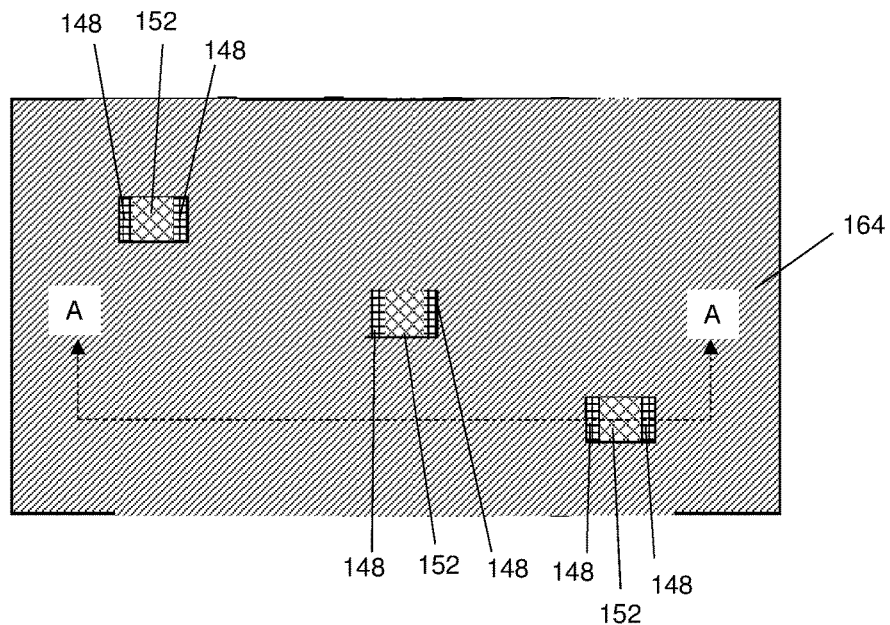
FIGS. 10A-10B show the integrated circuit structure undergoing aspects of a method according to embodiments of the disclosure with FIG. 10A showing a top-down view of the integrated circuit structure and FIG. 10B showing a cross-sectional view of the integrated circuit structure taken along line A-A of FIG. 10A.
Figure 10B:
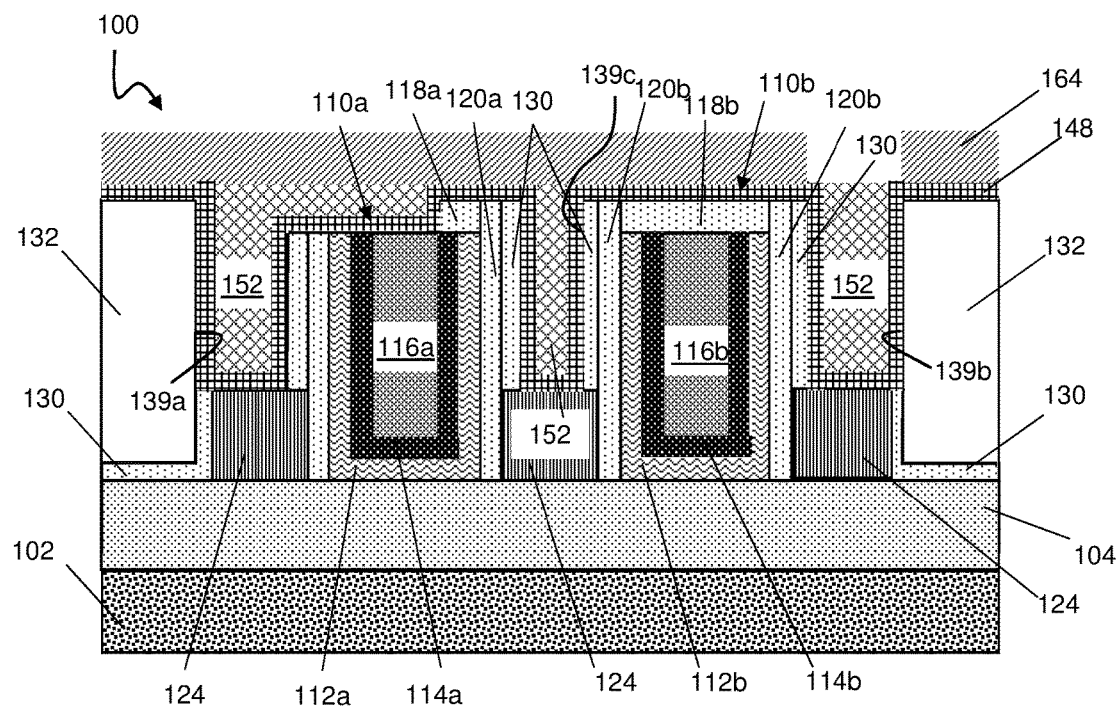

Referring now to FIGS. 10A-10B, where FIG. 10B shows a cross-section of IC structure 100 along line A-A of FIG. 10A, another mask 164 is formed over IC structure 100. That is, mask 164 is formed over exposed portions of liner layer 148 and sacrificial material 152. Mask 164 may be patterned and etched at locations where contact line spacers are desired to be formed as will be described herein. Therefore, it is to be understood that the patterning and etching of mask 164 is not limited to the locations shown in FIGS. 10A-10B. Rather, patterning and etching of mask 164 may be altered from that which is shown in FIGS. 10A-10B without departing from aspects of the disclosure as described herein. In such locations, mask 164 may be patterned and etched along sacrificial contact lines 156a, 156b, 156c to expose portions of liner layer 148 and sacrificial material 152 which are to be removed.

Figure 11A:
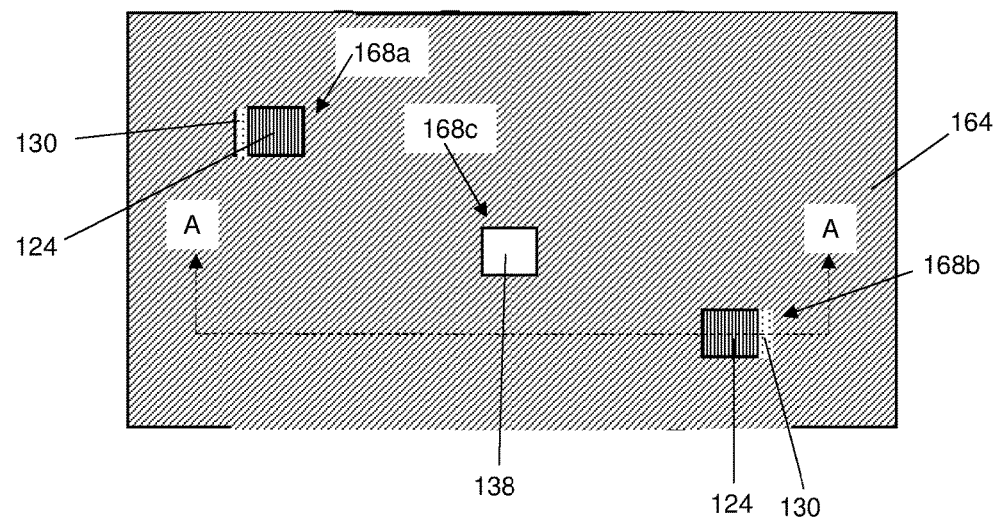
FIGS. 11A-11B show the integrated circuit structure undergoing aspects of a method according to embodiments of the disclosure with FIG. 11A showing a top-down view of the integrated circuit structure and FIG. 11B showing a cross-sectional view of the integrated circuit structure taken along line A-A of FIG. 11A.
Figure 11B:
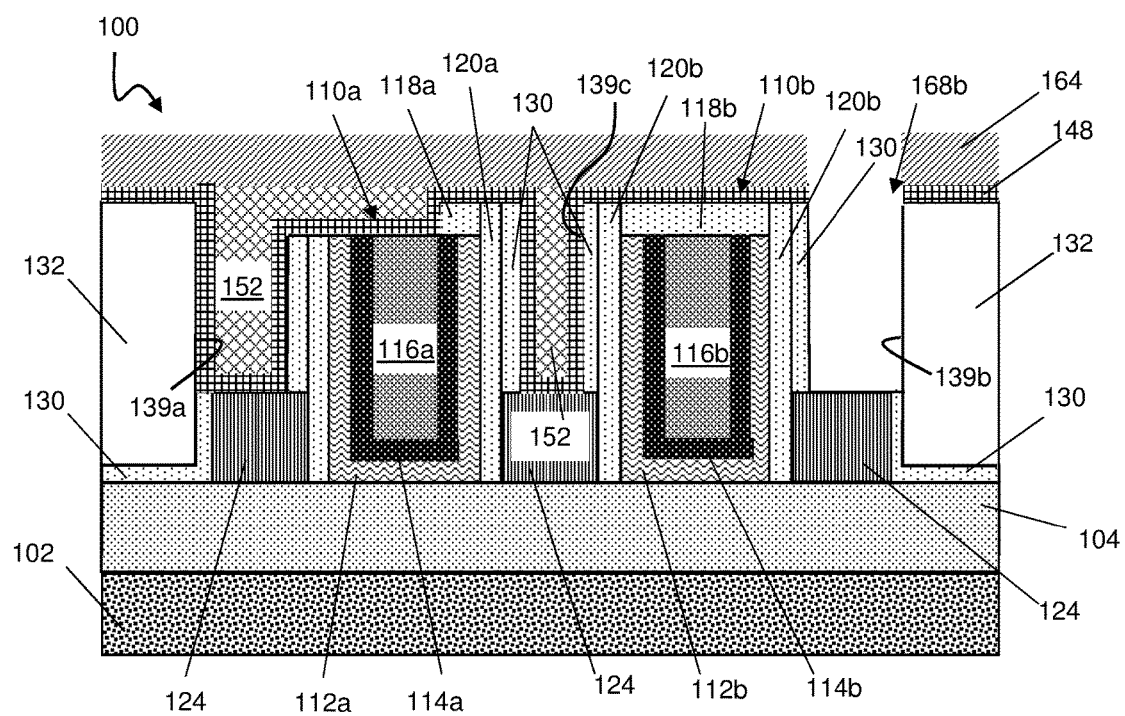

As shown in FIGS. 11A-11B, the exposed portions of liner layer 148 and sacrificial material 152 may be removed to expose source/drain epitaxial regions 124 (including dielectric cap layer 130 adjacent thereto) and/or STI regions 138 at the desired locations where contact line spacers are to be formed. In such an embodiment, a first etch, e.g., RIE etch using HBr, may be performed to remove the exposed sacrificial material 152 to expose liner layer 148 thereunder.

Then, a second etch, e.g., RIE etch using Cl⁻ or wet etch using HCl, may be performed to remove the exposed liner layer 148 to expose source/drain epitaxial region 124 and/or STI region 138 thereunder. Such etch processes create openings 168a, 168b, 168c within sacrificial contact lines 156a, 156b, 156c. It is to be understood that the position of openings 168a, 168b, 168c may be altered from that which is shown in FIGS. 11A-11B without departing from aspects of the disclosure as described herein. Subsequently, mask 164 (FIGS. 11A-11B) may be removed as shown in FIGS. 12A-12B.

Figure 12A:
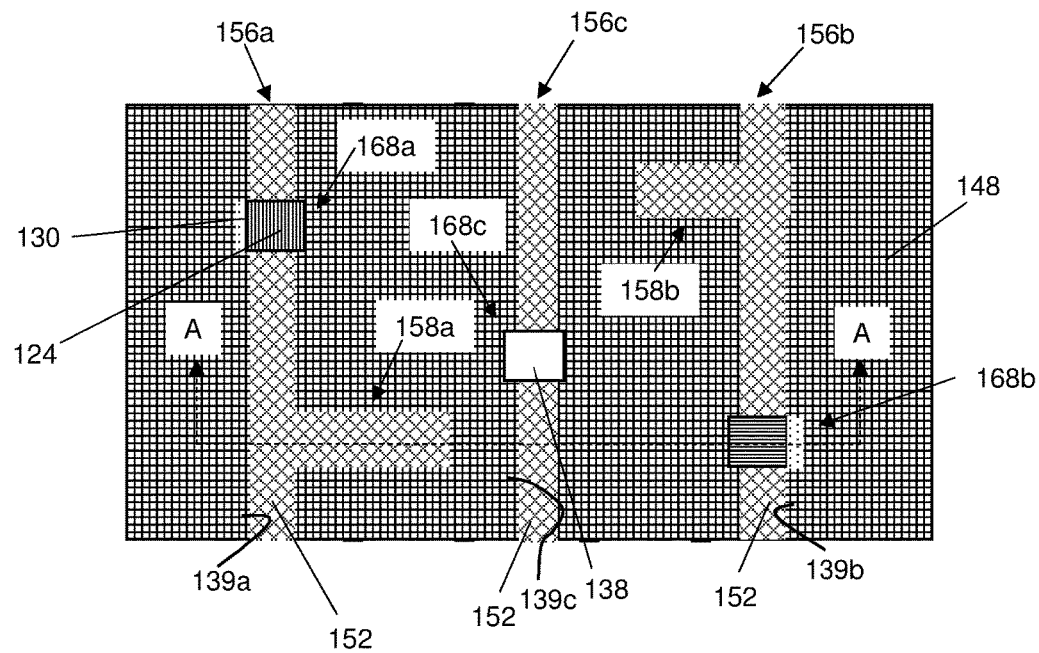
FIGS. 12A-12B show the integrated circuit structure undergoing aspects of a method according to embodiments of the disclosure with FIG. 12A showing a top-down view of the integrated circuit structure and FIG. 12B showing a cross-sectional view of the integrated circuit structure taken along line A-A of FIG. 12A.
Figure 12B:
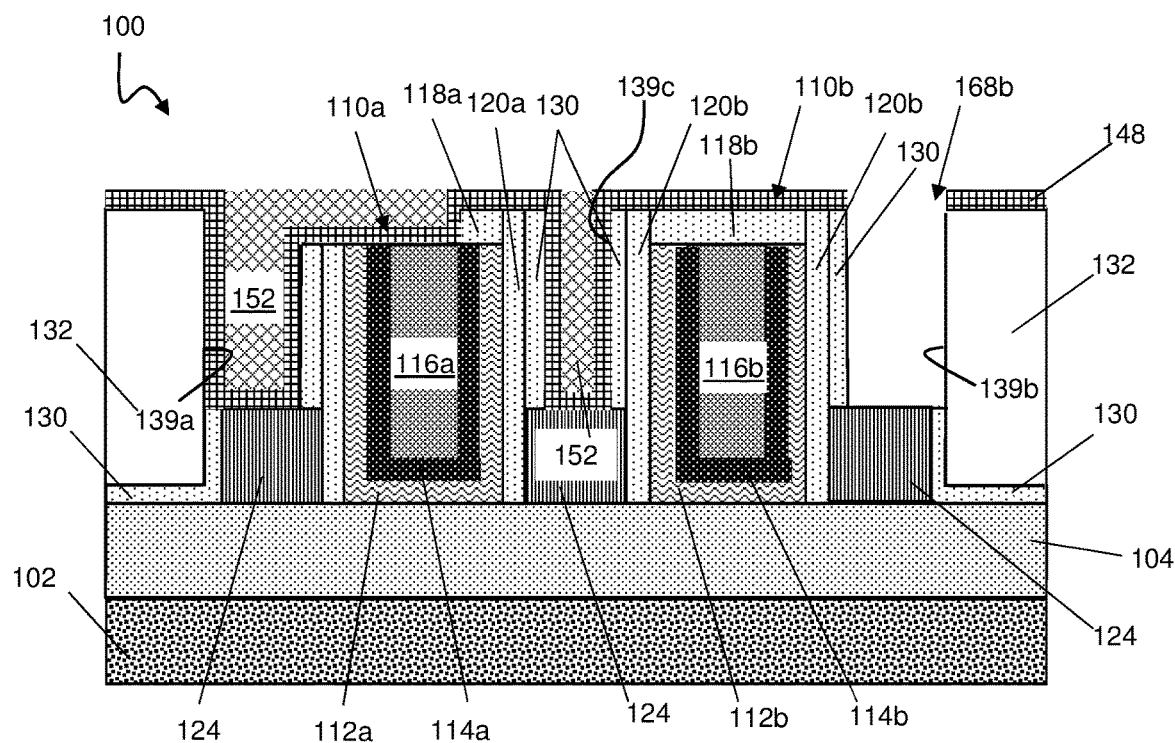
Figure 13A:
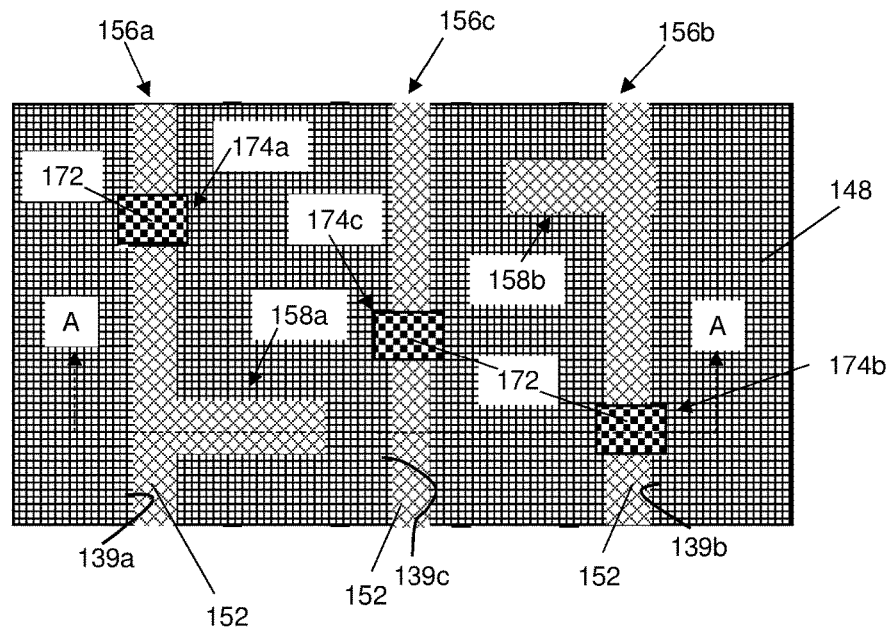
FIGS. 13A-13B show the integrated circuit structure undergoing aspects of a method according to embodiments of the disclosure with FIG. 13A showing a top-down view of the integrated circuit structure and FIG. 13B showing a cross-sectional view of the integrated circuit structure taken along line A-A of FIG. 13A.
Figure 13B:
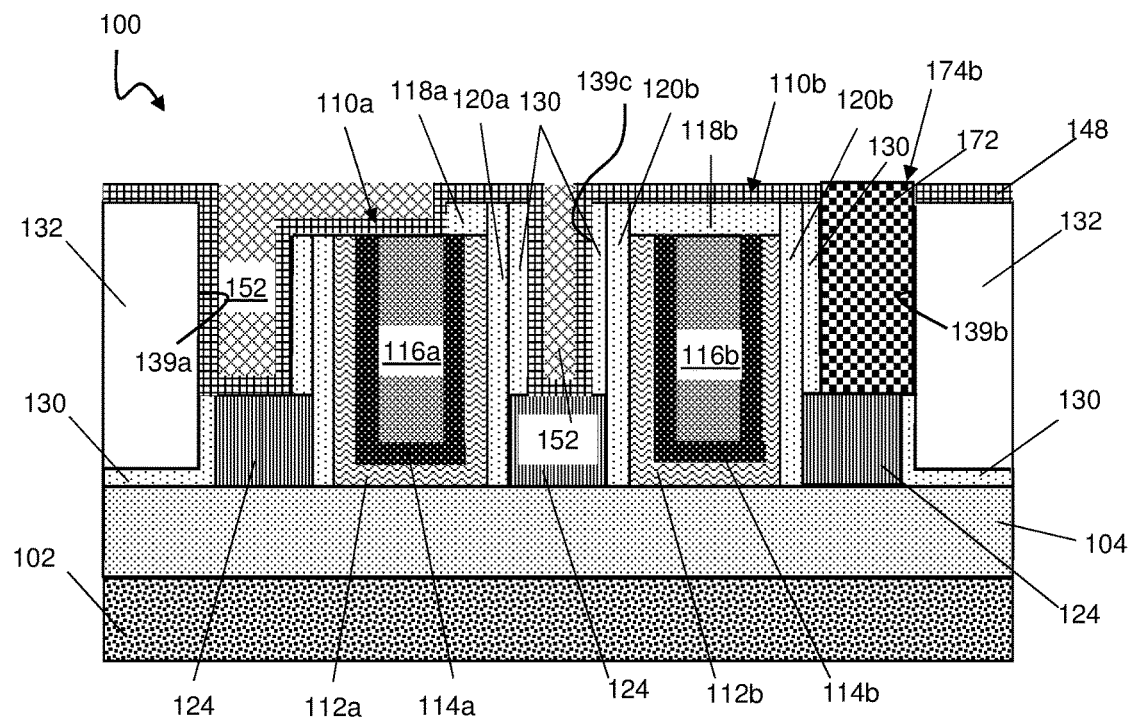

Referring now to FIGS. 13A-13B, a dielectric film 172 may be formed over IC structure 100 within openings 168a, 168b, 168c (FIG. 12A-12B). Subsequently, dielectric film 172 may be etched back or planarized to a surface of liner layer 148 over ILD layer 132 such that dielectric film 172 remains within openings 168a, 168b, 168c over the exposed source/drain epitaxial regions 124 (including dielectric cap layer 130 adjacent thereto) and/or STI regions 138 within trenches 139a, 139b, 139c. The remaining portions of dielectric film 172 form contact line spacers 174a, 174b, 174c. Dielectric film 172 may include, for example, a nitride, oxynitride, oxycarbide, oxycarbo nitride, oxyborocarbide, oxyboronitride or an oxide.

Figure 14A:
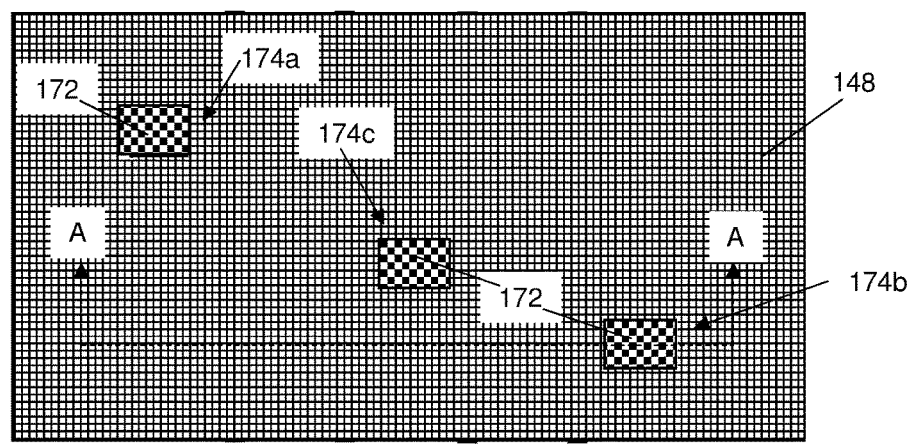
FIGS. 14A-14B show the integrated circuit structure undergoing aspects of a method according to embodiments of the disclosure with FIG. 14A showing a top-down view of the integrated circuit structure and FIG. 14B showing a cross-sectional view of the integrated circuit structure taken along line A-A of FIG. 14A.
Figure 14B:
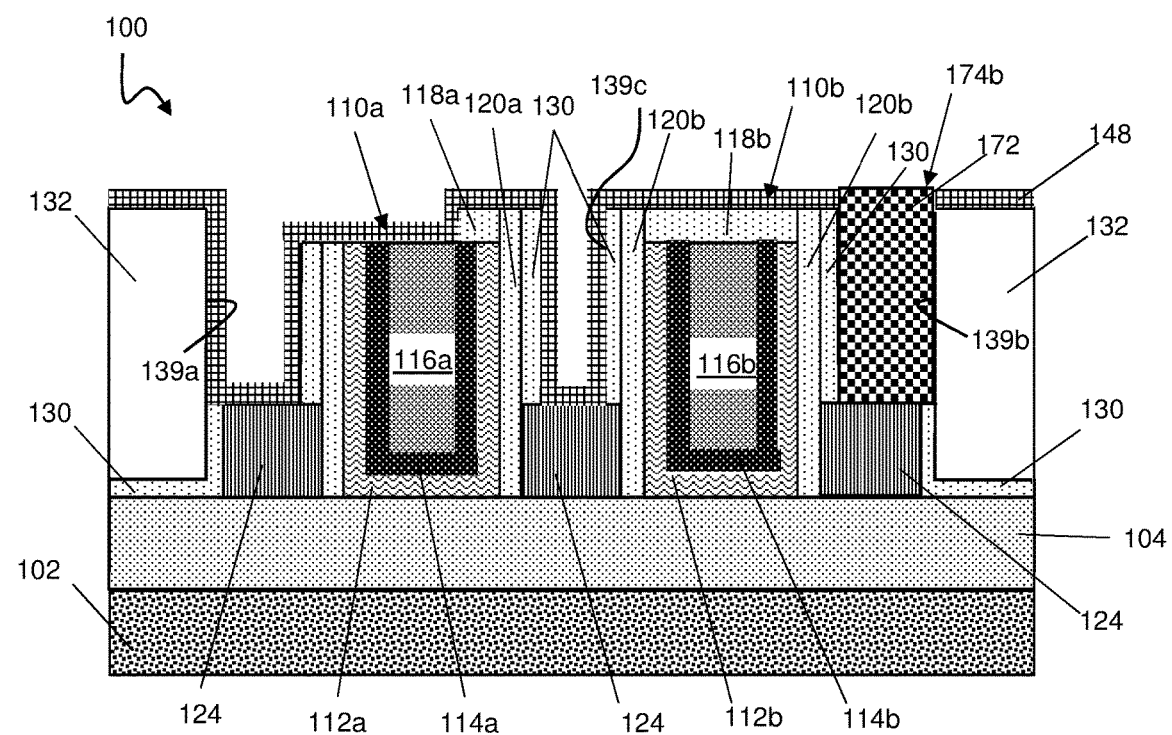
Figure 15A:
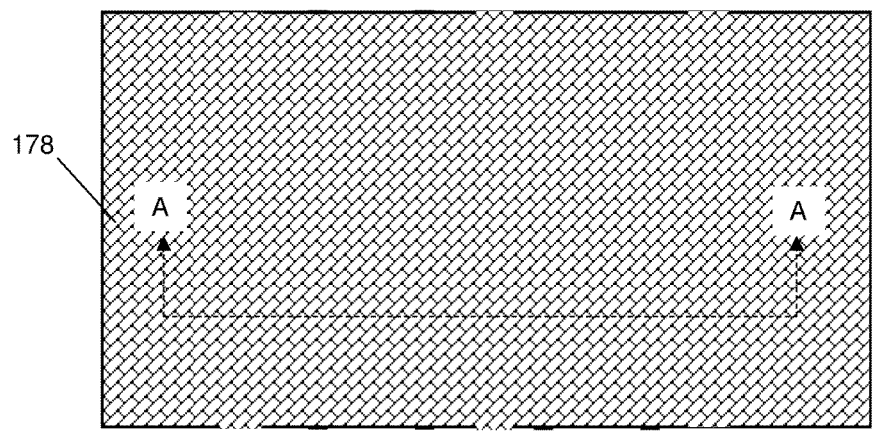
FIGS. 15A-15B show the integrated circuit structure undergoing aspects of a method according to embodiments of the disclosure with FIG. 15A showing a top-down view of the integrated circuit structure and FIG. 15B showing a cross-sectional view of the integrated circuit structure taken along line A-A of FIG. 15A.
Figure 15B:
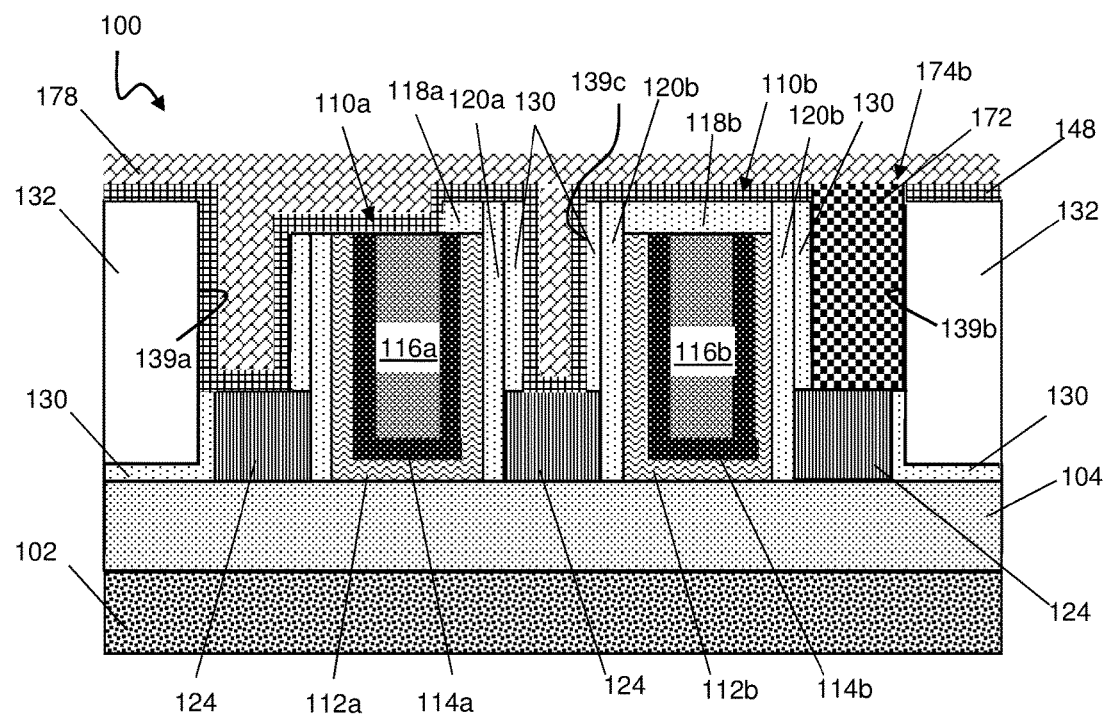
Figure 16A:
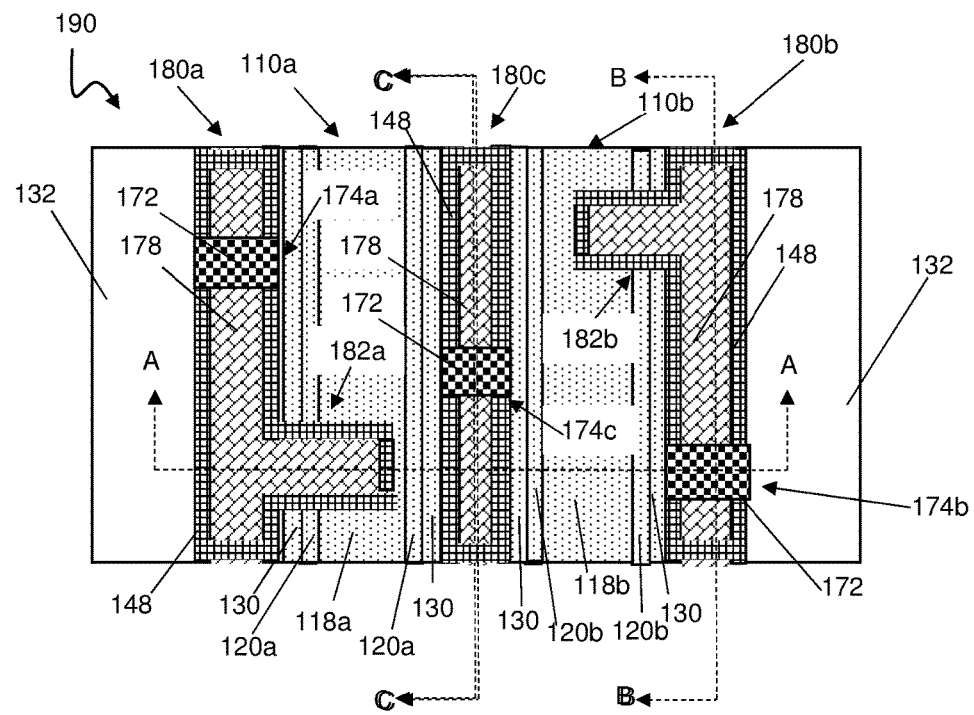
FIGS. 16A-16B show a resulting integrated circuit structure having undergone aspects of a method according to embodiments of the disclosure with FIG. 16A showing a top-down view of the integrated circuit structure and FIG. 16B showing a cross-sectional view of the integrated circuit structure taken along line A-A of FIG. 16A.

As shown in FIGS. 14A-14B, sacrificial material 152 may be removed from trenches 138a, 138b, 138c (FIGS. 13A-13B) to expose liner layer 148 thereunder. Sacrificial material 152 may be removed by etching, e.g., a RIE etch. Referring now to FIGS. 15A-15B, a metal 178 may be formed over exposed liner layer 148 and contact line spacers 174a, 174b, 174c to form contact lines 180a, 180b, 180c. Metal 178 may include for example, at least one of: tungsten, cobalt, or copper. Subsequently, IC structure 100 (FIGS. 15A-15B) may be planarized to a top surface of ILD layer 132 to create a resulting IC structure 190 as shown in FIGS. 16A-16B.

Figure 16B:
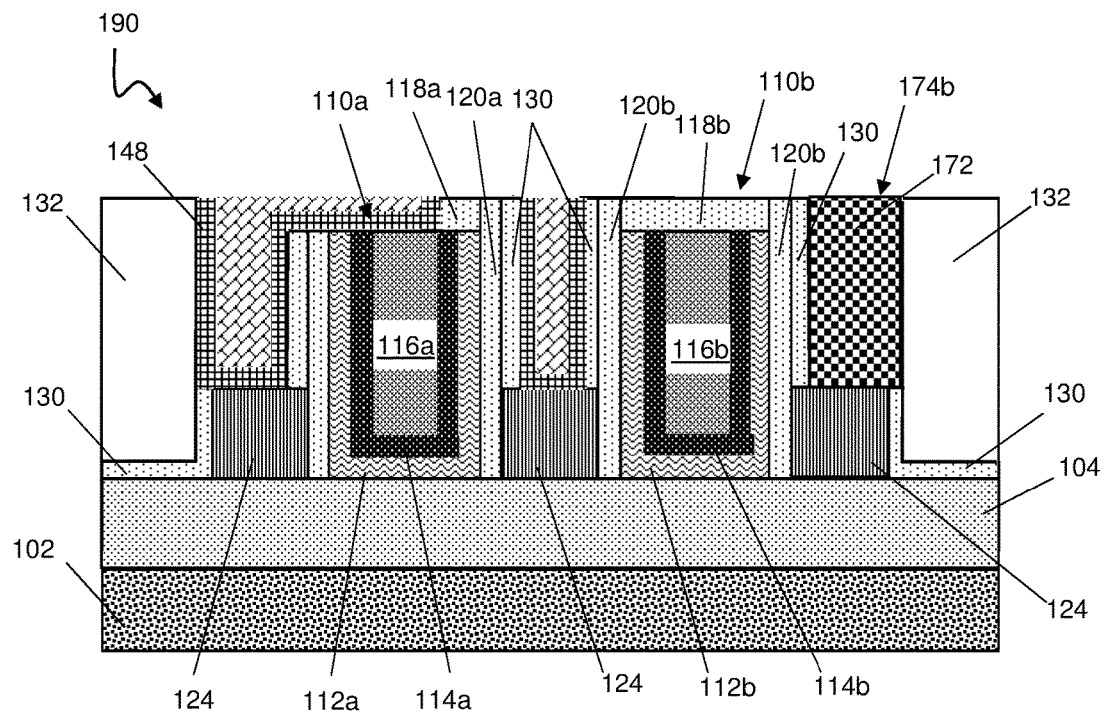

IC structure 190 may include ILD layer 132 over a set of fins, e.g., including fin 104 (FIG. 16B). Within ILD layer 132, one or more gate structures 110a, 110b may be disposed perpendicular to fins, e.g., fin 104, such that gate structure 110a, 110b substantially surround fins, e.g., fin 104. Further, source/drain epitaxial regions 124 may be disposed such that source/drain epitaxial regions 124 (FIG. 16B) are over and substantially surround the fins, e.g., fin 104. Source/drain epitaxial regions 124 may be disposed on opposing sides of gate structures 110a, 110b. Source/drain contact lines 180a, 180b, 180c may be disposed over source/drain epitaxial regions 124 (and/or in some cases, over STI region 138 (FIG. 12A)) within ILD layer 132. Source/drain contact lines 180a, 180b, 180c may include portions of liner layer 148 over source/drain epitaxial regions 124 (and/or in some cases, over STI region 138) within ILD layer 132. Source/drain contact lines 180a, 180b, 180c may also include portions of metal 178 within liner layer 148. As known in the art, contact lines 180a, 180b, 180c provide electrical connection between source/drain epitaxial regions 124 and structures which are to be fabricated in metal levels over ILD layer 132.

Source/drain contact lines 180a, 180b, 180c may include contact line spacers 174a, 174b, 174c therein. Contact line spacers 174a, 174b, 174c may be composed of dielectric film 172 and provide electrical isolation between portions of source/drain contact lines 180a, 180b, 180c such that the portions of source/drain contact lines 180a, 180b, 180c separated by contact line spacers 174a, 174b, 174c may be considered distinct source/drain contact lines.

In some embodiments, IC structure 190 may include gate contacts 182a, 182b which are in electrical connection with source/drain contact lines 180a, 180b, 180c. In such an embodiment, gate contacts 182a, 182b are in contact with at least a portion of gate conductor 116a, 116b of gate structures 110a, 110b. Gate contacts 182a, 182b may include portions of liner layer 148 and portions of metal 178. Liner layer 148 of gate contacts 182a, 182b may directly contact gate conductor 116a, 116b. Liner layer 148 and metal 178 of gate contacts 182a, 182b may be continuous with, and formed at the same time as, liner layer 148 and metal 178 of source/drain contacts 180a, 180b, 180c as described according to methods according embodiments of the disclosure.

Figure 17:
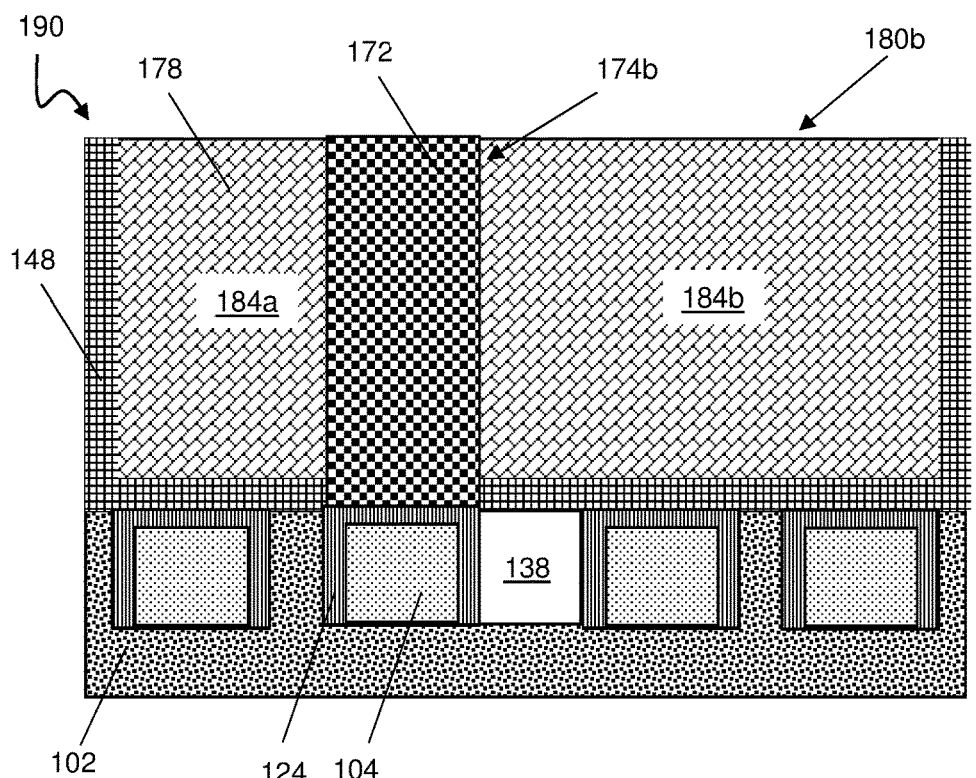
FIG. 17 shows a cross-sectional view of the integrated circuit structure of FIG. 16A taken along line B-B.
Figure 18:
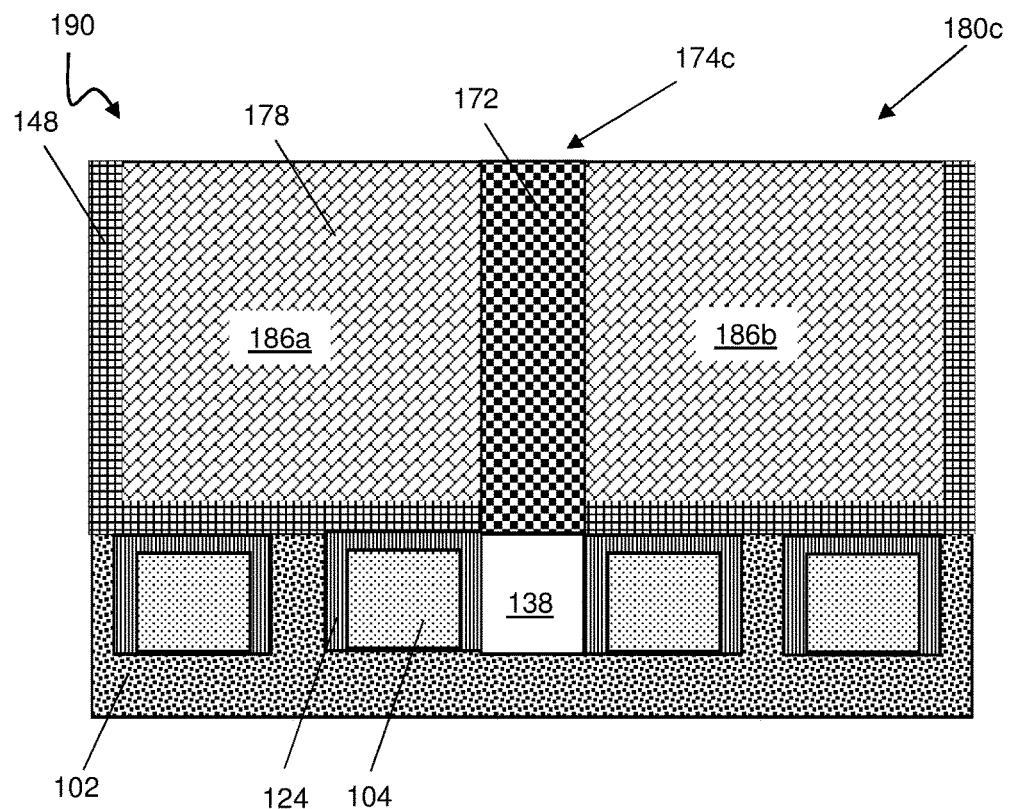
FIG. 18 shows a cross-sectional view of the integrated circuit structure of FIG. 16A taken along line C-C.

FIG. 17 shows a cross-sectional view of IC structure 190 taken along line B-B through source/drain contact line 180b. As shown in FIG. 17, source/drain contact line 180b includes contact line spacer 174b comprising dielectric film 172 over source/drain epitaxial region 124 substantially surrounding fin 104. Spacer 174b substantially isolates a first portion 184a of source/drain contact line 180b from a second portion 182b of source/drain contact line 180b. Each portion 184a, 184b may include portions of liner layer 148 and portions of metal 178. Portions 184a, 184b, may act as distinct contact lines. As shown, FIG. 18 shows a cross-sectional view of IC structure 190 taken along line C-C through source/drain contact line 180c. As shown in FIG. 18, source/drain contact line 180c includes source/drain contact line spacer 174c comprising dielectric film 172 over STI region 138 substantially separating fin 104 from an adjacent fin. Spacer 174c substantially isolates a first portion 186a of source/drain contact line 180c from a second portion 186b of source drain contact line 180c. Each portion 186a, 186b may include portions of liner layer 148 and portions of metal 178. Portions 186a, 186b, may act as distinct contact lines.

In conventional contact lines having contact lines spacers therein, the contact line spacers are substantially separated from the metal of the contact lines by the liner layer. That is, the liner layer of conventional contact lines also line the contact line spacers therein. As IC structures continue to scale down in size, the real estate on IC structures becomes more valuable. Thus, aspects of the present disclosure provide for the absence of such a liner layer immediately adjacent to the contact line spacer providing additional real estate to be used for the contact line metal. As such, the contact line spacers described herein are in direct contact with the contact line metal resulting in improved resistance as compared to conventional IC structures having contact line spacers.

It is to be understood that source/drain contact lines 180a, 180b, 180c, and contact line spacers 174a, 174b, 174c therein, are not limited to the orientations shown or described herein. Rather, as previously discussed, the design of IC structure 190 may be customized based on the desired application of IC structure 190 by altering the patterning and etching of mask 164 (FIGS. 10A-11B) and/or mask 140 (FIGS. 5A-6B). However, in any instance, contact line spacers fabricated according to embodiments of the disclosure as described with respect to FIGS. 1A-18, will not include a liner layer substantially separated the contact line metal from the contact line spacer. Further, any number of contact lines, contact line spacers, and gate contacts may be formed without departing from embodiments of the disclosure.

Figure 19A:
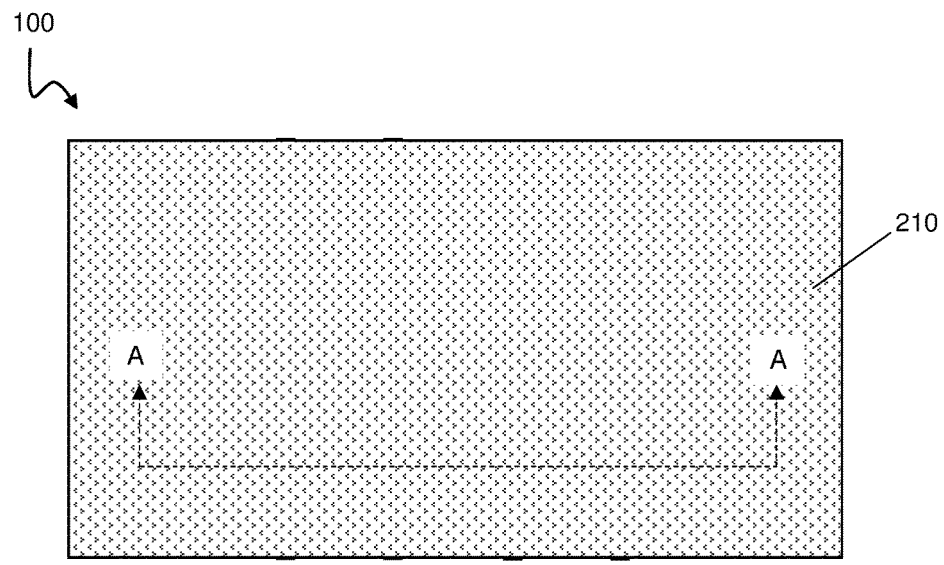
FIGS. 19A-19B show the integrated circuit structure undergoing aspects of a method according to embodiments of the disclosure with FIG. 19A showing a top-down view of the integrated circuit structure and FIG. 19B showing a cross-sectional view of the integrated circuit structure taken along line A-A of FIG. 19A.
Figure 19B:
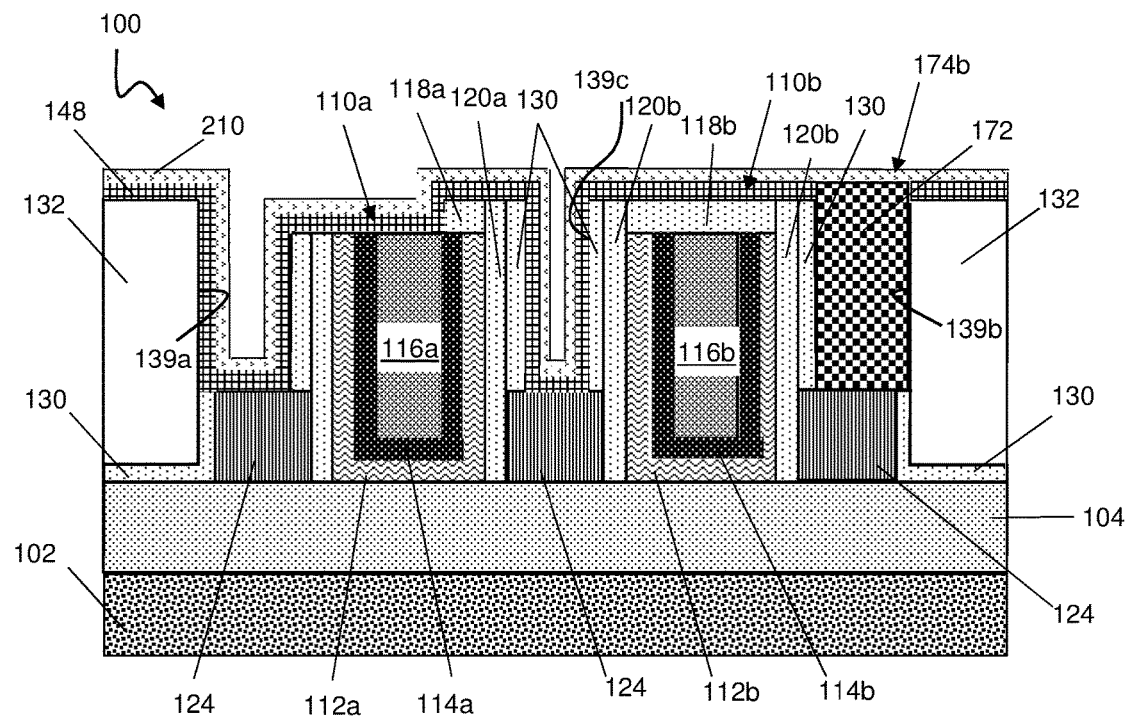

FIGS. 19A-23 show an IC structure according to another embodiment of the disclosure. In this embodiment, after contact line spacers 174a, 174b, 174c (FIG. 13A) are formed and sacrificial material 152 (FIGS. 13A-13B) is removed as discussed relative to FIGS. 14A-14B, another liner layer 210 may be formed over IC structure 100 as shown in FIGS. 19A-19B. In such an embodiment, liner layer 210 may be formed over exposed portions of liner layer 148 and contact line spacers 174a, 174b, 174c. Liner layer 210 may include any of the materials discussed relative to liner layer 148. However, liner layer 210 may be formed to have a thickness of approximately 0.5 nm to approximately 5 nm. As discussed herein, liner layer 148 may have a thickness of approximately 1 nm to approximately 10 nm. As such, liner layer 210 may be thinner than liner layer 148. As shown, liner layer 210 may be formed to substantially coat exposed liner layer 148 within trenches 139a, 139b, 139c (FIG. 19B). Liner layer 210 may also be formed over contact liner spacers 174a, 174b, 174c outside of trenches 139a, 139b, 139c.

Figure 20A:
FIGS. 20A-20B show the integrated circuit structure undergoing aspects of a method according to embodiments of the disclosure with FIG. 20A showing a top-down view of the integrated circuit structure and FIG. 20B showing a cross-sectional view of the integrated circuit structure taken along line A-A of FIG. 20A.
Figure 20B:
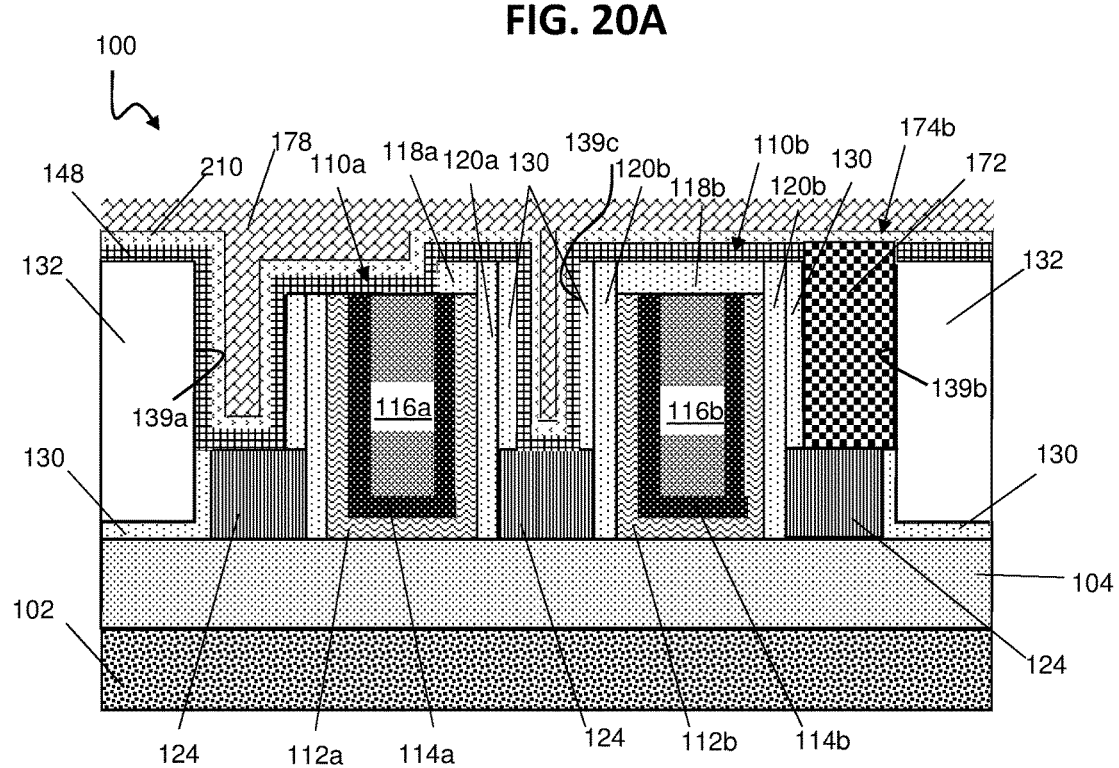
Figure 21A:
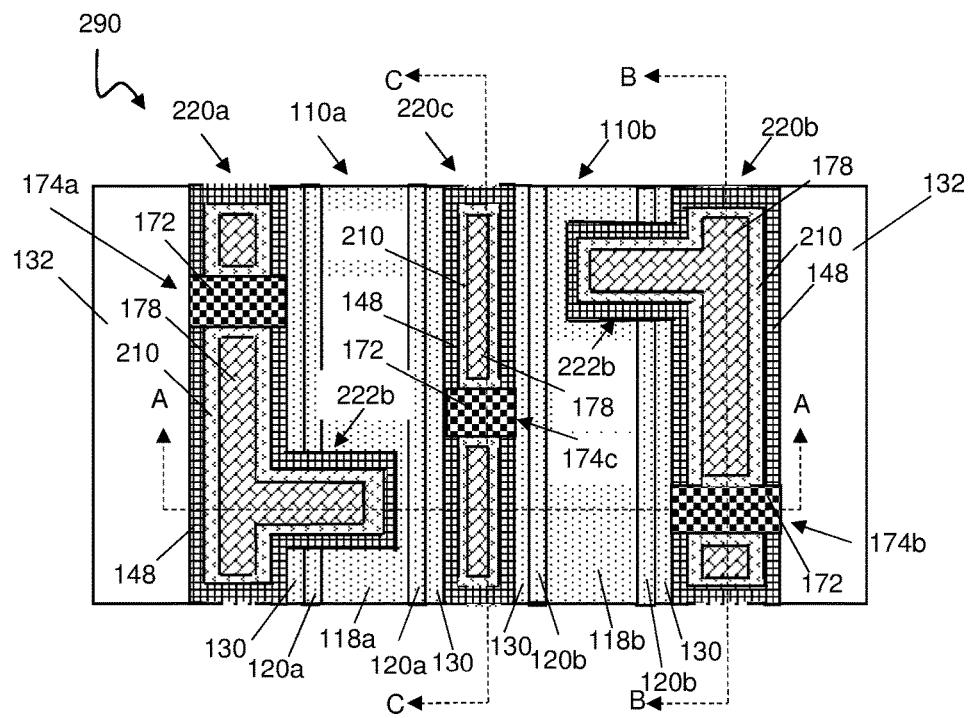
FIGS. 21A-21B show the integrated circuit structure undergoing aspects of a method according to embodiments of the disclosure with FIG. 21A showing a top-down view of the integrated circuit structure and FIG. 21B showing a cross-sectional view of the integrated circuit structure taken along line A-A of FIG. 21A.
Figure 21B:
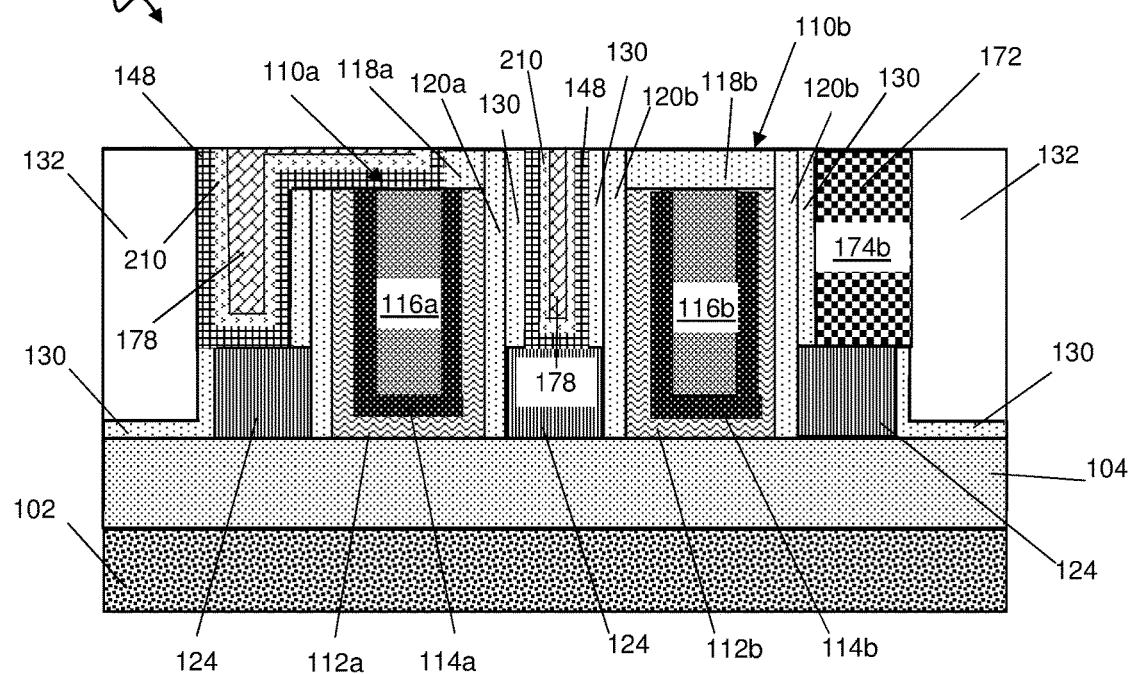

As shown in FIGS. 20A-20B, metal 178 may be formed as described with respect to FIGS. 15A-15B. Subsequently, IC structure 100 may undergo a planarization process such that material outside of trench openings 139a, 139b, 139c are removed and become planar with ILD layer 132 to create a resulting IC structure 290 having source/drain contact lines 220a, 220b, 220c as shown in FIGS. 21A-21B.

IC structure 290 may include ILD layer 132 over a set of fins, e.g., including fin 104 (FIG. 16B). Within ILD layer 132, one or more gate structures 110a, 110b may be disposed perpendicular to fins, e.g., fin 104, such that gate structure 110a, 110b substantially surround fins, e.g., fin 104. Further, source/drain epitaxial regions 124 may be disposed such that source/drain epitaxial regions 124 (FIG. 16B) are over and substantially surround the fins, e.g., fin 104. Source/drain epitaxial regions 124 may be disposed on opposing sides of gate structures 110a, 110b. Source/drain contact lines 220a, 220b, 220c may be disposed over source/drain epitaxial regions 124 (and/or in some cases, over STI region 138 (FIG. 12A)) within ILD layer 132. Source/drain contact lines 220a, 220b, 220c may include portions of liner layer 148 over source/drain epitaxial regions 124 (and/or in some cases, over STI region 138) within ILD layer 132. Source/drain contact lines 220a, 220b, 220c may also include portions of liner layer 210 within liner layer 148. Additionally, source/drain contact lines 220a, 220b, 220c may include metal 178 within liner layer 210. As known in the art, source/drain contact lines 220a, 220b, 220c provide electrical connection between source/drain epitaxial regions 124 and structures which are to be fabricated in metal levels over ILD layer 132.

Source/drain contact lines 220a, 220b, 220c may include contact line spacers 174a, 174b, 174c therein. Contact line spacers 174a, 174b, 174c may be composed of dielectric film 172 and provide electrical isolation between portions of source/drain contact lines 220a, 220b, 220c such that the portions of source/drain contact lines 220a, 220b, 220c separated by contact line spacers 174a, 174b, 174c may be considered distinct source/drain contact lines.

In some embodiments, IC structure 290 may include gate contacts 222a, 222b which are in electrical connection with source/drain contact lines 220a, 220b, 220c. In such an embodiment, gate contacts 222a, 222b are in contact with at least a portion of gate conductor 116a, 116b of gate structures 110a, 110b. Gate contacts 222a, 222b may include portions of liner layers 148, 210 and portions of metal 178. Liner layer 148 of gate contacts 222a, 222b may directly contact gate conductor 116a, 116b. Liner layers 148, 210 and metal 178 of gate contacts 222a, 222b may be continuous with, and formed at the same time as, liner layers 148, 210 and metal 178 of source/drain contacts 220a, 220b, 220c as described according to methods according to embodiments of the disclosure.

Figure 22:
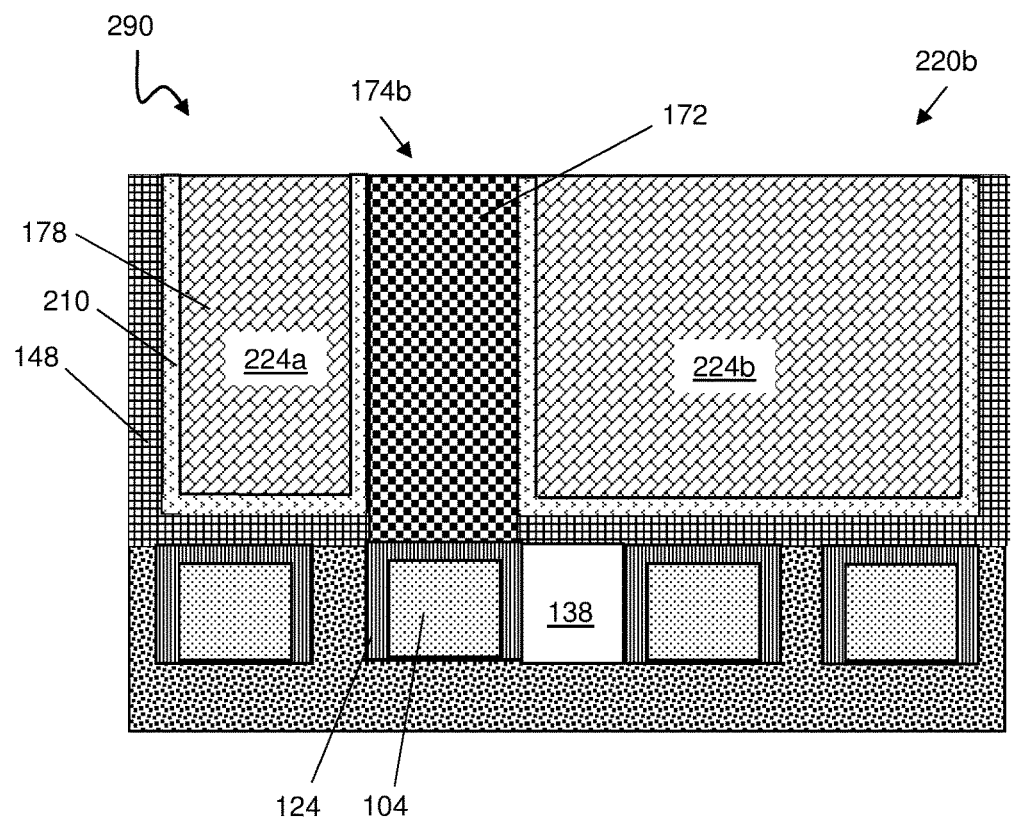
FIG. 22 shows a cross-sectional view of the integrated circuit structure of FIG. 21A taken along line B-B.
Figure 23:
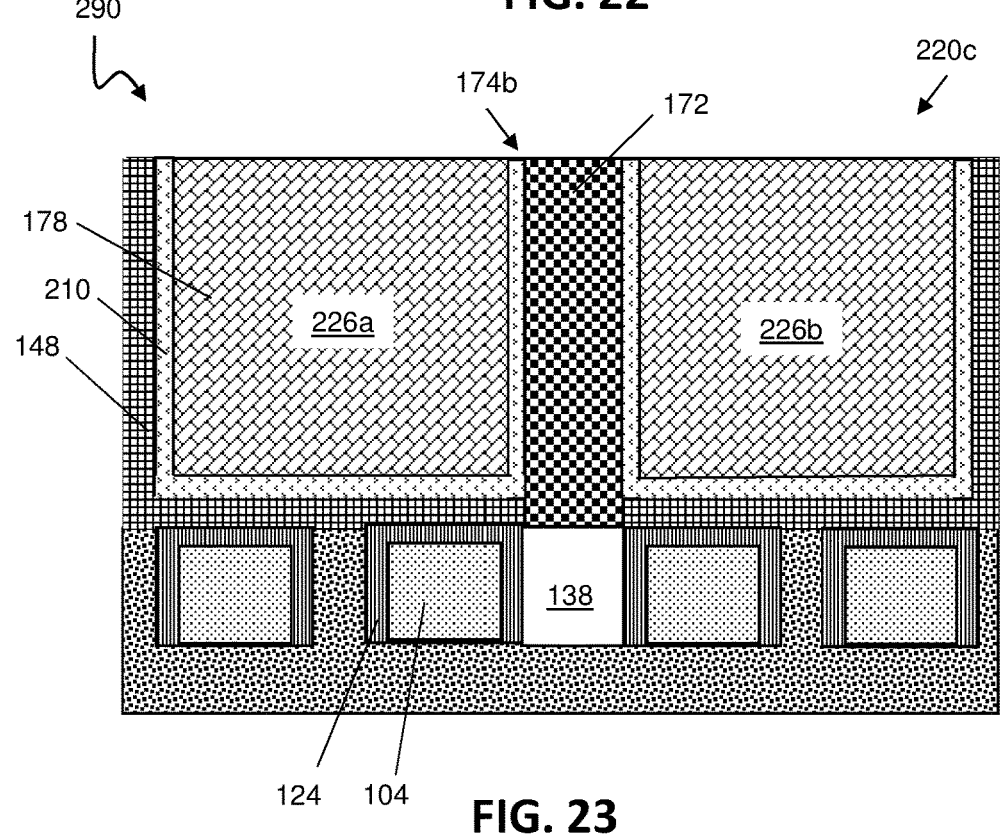
FIG. 23 shows a cross-sectional view of the integrated circuit structure of FIG. 21A taken along line C-C.

FIG. 22 shows a cross-sectional view of IC structure 290 taken along line B-B through source/drain contact line 220b. As shown in FIG. 22, source/drain contact line 180b includes contact line spacer 174b comprising dielectric film 172 over source/drain epitaxial region 124 substantially surrounding fin 104. Spacer 174b substantially isolates a first portion 224a of source/drain contact line 220b from a second portion 224b of source/drain contact line 220b. Each portion 224a, 224b may include portions of liner layers 148, 210 and portions of metal 178. As shown, FIG. 23 shows a cross-sectional view of IC structure 290 taken along line C-C through source/drain contact line 220c. As shown in FIG. 18, source/drain contact line 220c includes source/drain contact line spacer 174c comprising dielectric film 172 over STI region 138 substantially separating fin 104 from an adjacent fin. Spacer 174c substantially isolates a first portion 226a of source/drain contact line 220c from a second portion 226b of source drain contact line 220c. Each portion 226a, 226b may include portions of liner layers 148, 210 and portions of metal 178.

In conventional contact lines having contact line spacers therein, the contact line spacers are substantially separated from the metal of the contact lines by the liner layer. That is, the liner layer of conventional contact lines also line the contact line spacers therein. As IC structures continue to scale down in size, the real estate on IC structures becomes more valuable. Thus, aspects of the present disclosure according to this embodiment provide for a thinner liner layer immediately adjacent to the contact line spacer providing additional real estate to be used for the contact line metal. The thinner liner layer described herein is formed after the formation of the contact liner spacer and before the contact line metal. As such, the IC structures formed according to this embodiment result in improved resistance as compared to conventional IC structures having contact line spacers.

It is to be understood that source/drain contact lines 220a, 220b, 220c, and contact line spacers 174a, 174b, 174c therein, are not limited to the orientations shown or described herein. Rather, as previously discussed, the design of IC structure 290 may be customized based on the desired application of IC structure 290 by altering the patterning and etching of mask 164 (FIGS. 10A-11B) and/or mask 140 (FIGS. 5A-6B). However, in any instance, contact line spacers fabricated according to this embodiment of the disclosure as described with respect to FIGS. 19A-23, will include a thinner liner layer substantially separating the contact line metal from the contact line spacer. Further, any number of contact lines, contact line spacers, and gate contacts may be formed without departing from embodiments of the disclosure.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. An integrated circuit structure comprising:
   a contact line being disposed within a dielectric layer and providing electrical connection to source/drain epitaxial regions surrounding a set of fins, the contact line including:
     a first portion of the contact line electrically isolated from a second portion of the contact line by a contact line spacer,
     wherein the first portion and the second portion each include a liner layer and a metal, the liner layer separating the metal from the dielectric layer and the source/drain epitaxial regions, and
     wherein the metal is in direct contact with a first portion of the contact line spacer, and wherein the liner layer is in direct contact with a second portion of the contact line spacer, the second portion of the contact line spacer positioned below the first portion of the contact line spacer.

2. The integrated circuit structure of claim 1, wherein the contact liner spacer includes a nitride or an oxide.

3. The integrated circuit structure of claim 1, wherein the metal includes at least one of: tungsten, cobalt, or copper.

4. The integrated circuit structure of claim 1, wherein the liner layer includes at least one of: titanium, titanium nitride, tantalum, or tantalum nitride.

5. The integrated circuit structure of claim 1, further comprising:
   a gate contact line providing electrical connection to a gate conductor of a gate structure and the contact line, the gate contact line including:
     a portion of the liner layer in direct contact with the gate conductor, and
     a portion of the metal over the liner layer that is in direct contact with the gate conductor.

6. An integrated circuit structure comprising:
   a contact line disposed within a dielectric layer and electrically connected to source/drain epitaxial regions surrounding a set of fins, the contact line including:
     a first portion of the contact line electrically isolated from a second portion of the contact line by a contact line spacer,
     wherein the first portion and the second portion each include a liner layer and a metal, the liner layer separating the metal from the dielectric layer and the source/drain epitaxial regions, and
   wherein the metal is directly in contact with the contact line spacer; and
     a gate contact line electrically connected to a gate conductor of a gate structure.

7. The integrated circuit structure of claim 6, wherein the contact liner spacer includes a nitride or an oxide.

8. The integrated circuit structure of claim 6, wherein the metal includes at least one of: tungsten, cobalt, or copper.

9. The integrated circuit structure of claim 6, wherein the liner layer includes at least one of: titanium, titanium nitride, tantalum, or tantalum nitride.

10. The integrated circuit structure of claim 6, wherein the gate contact line includes:
    a portion of the liner layer in direct contact with the gate conductor, and
    a portion of the metal over the liner layer that is in direct contact with the gate conductor.

11. An integrated circuit structure comprising:
    a contact line disposed within a dielectric layer and electrically connected to source/drain epitaxial regions surrounding a set of fins, the contact line including:
      a first portion of the contact line electrically isolated from a second portion of the contact line by a contact line spacer,
      wherein the first portion and the second portion each include a liner layer and a metal, the liner layer separating the metal from the dielectric layer and the source/drain epitaxial regions, and
      wherein the metal is directly in contact with the contact line spacer; and
    a gate contact line electrically connected to a gate conductor of a gate structure and the contact line, the gate contact line including:
      a portion of the liner layer in direct contact with the gate conductor, and
      a portion of the metal over the liner layer that is in direct contact with the gate conductor.

12. The integrated circuit structure of claim 11, wherein the contact liner spacer includes a nitride or an oxide.

13. The integrated circuit structure of claim 11, wherein the metal includes at least one of: tungsten, cobalt, or copper.

14. The integrated circuit structure of claim 11, wherein the liner layer includes at least one of: titanium, titanium nitride, tantalum, or tantalum nitride.

* * * * *